(12) United States Patent
Yagi et al.

(10) Patent No.: US 8,002,390 B2
(45) Date of Patent: Aug. 23, 2011

(54) PIEZOELECTRIC ELEMENT SUBSTRATE, LIQUID DROPLET EJECTING HEAD, LIQUID DROPLET EJECTING DEVICE, AND PIEZOELECTRIC ELEMENT SUBSTRATE MANUFACTURING METHOD

(75) Inventors: Takashi Yagi, Kanagawa (JP); Hiroyuki Usami, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 208 days.

(21) Appl. No.: 12/243,039

(22) Filed: Oct. 1, 2008

(65) Prior Publication Data
US 2009/0207214 A1    Aug. 20, 2009

(30) Foreign Application Priority Data
Feb. 20, 2008 (JP) ................. 2008-038775

(51) Int. Cl.
B41J 2/045 (2006.01)
H01L 41/00 (2006.01)
(52) U.S. Cl. .......................... 347/71; 310/365
(58) Field of Classification Search ............... 347/71
See application file for complete search history.

(56) References Cited

U.S. PATENT DOCUMENTS
6,336,717 B1 * 1/2002 Shimada et al. ............. 347/71
2003/0081080 A1   5/2003 Moriya et al.
2006/0232639 A1 * 10/2006 Sumi et al. ............ 347/68

FOREIGN PATENT DOCUMENTS
| JP | 11-307832 | 11/1999 |
| JP | 2001-260357 | 9/2001 |
| JP | 2003-062999 | 3/2003 |
| JP | 2003-188428 | 7/2003 |
| JP | 2003-188429 | 7/2003 |
| JP | 2003-188432 | 7/2003 |
| JP | 2003-291343 | 10/2003 |
| JP | 2005-153369 | 6/2005 |
| JP | 2006-019718 | 1/2006 |

* cited by examiner

Primary Examiner — Matthew Luu
Assistant Examiner — Lisa M Solomon
(74) Attorney, Agent, or Firm — Fildes & Outland, P.C.

(57) ABSTRACT

A piezoelectric element substrate is provided with a support substrate, an insulating orientation auxiliary layer formed on the support substrate, a lower electrode layer formed on the orientation auxiliary layer so that an uncoated portion where the orientation auxiliary layer is not coated with the lower electrode layer is constituted at least a portion thereof, a piezoelectric substance layer formed on the lower electrode layer and the uncoated portion of the orientation auxiliary layer, and an upper electrode layer formed on the piezoelectric substance layer, wherein the orientation auxiliary layer and the piezoelectric substance layer comprise a material of the same crystal system.

7 Claims, 31 Drawing Sheets

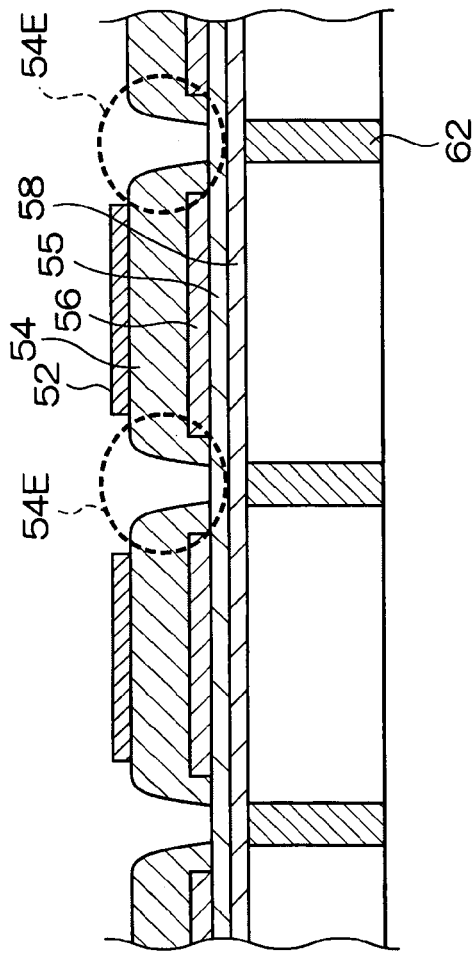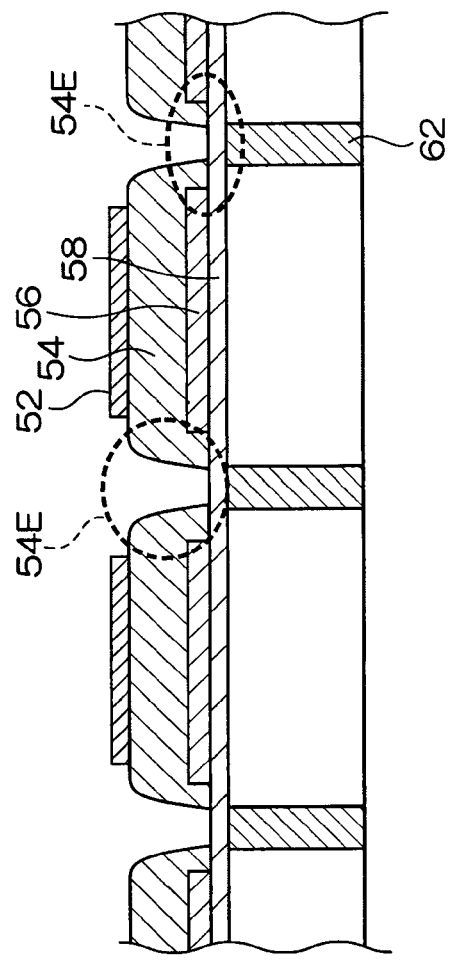

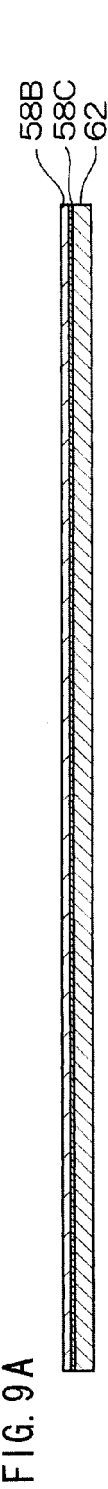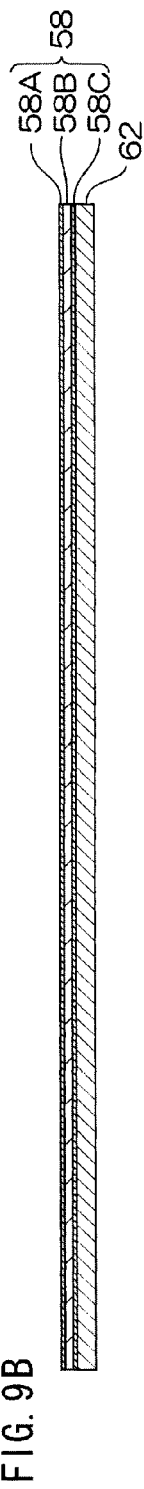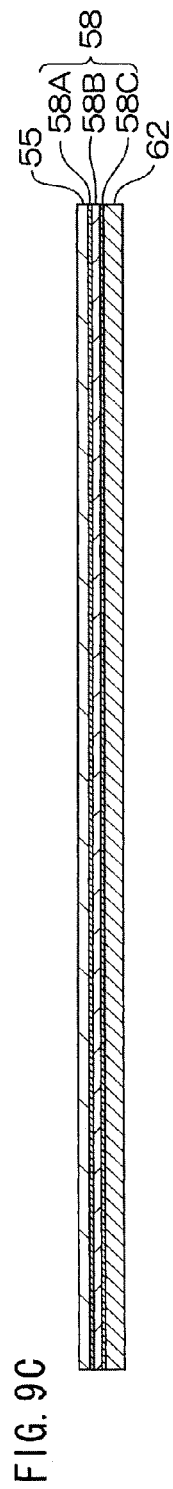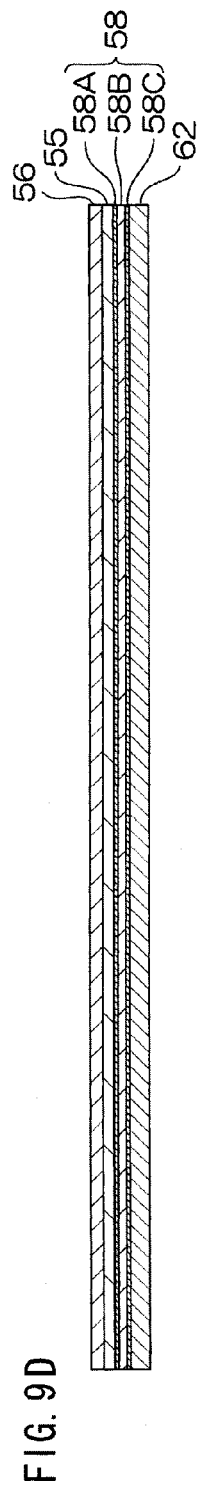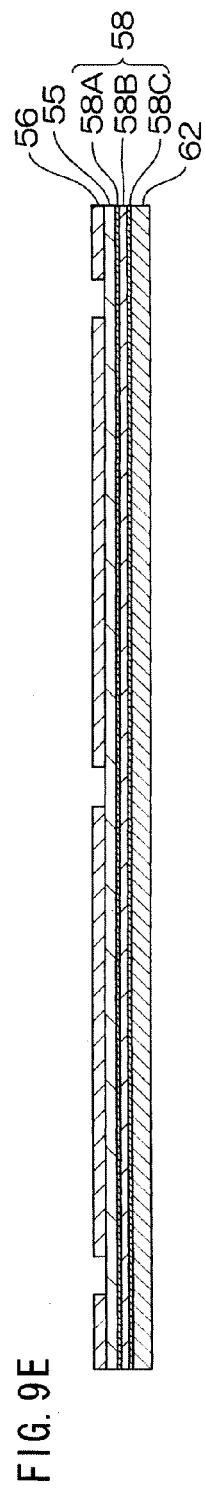

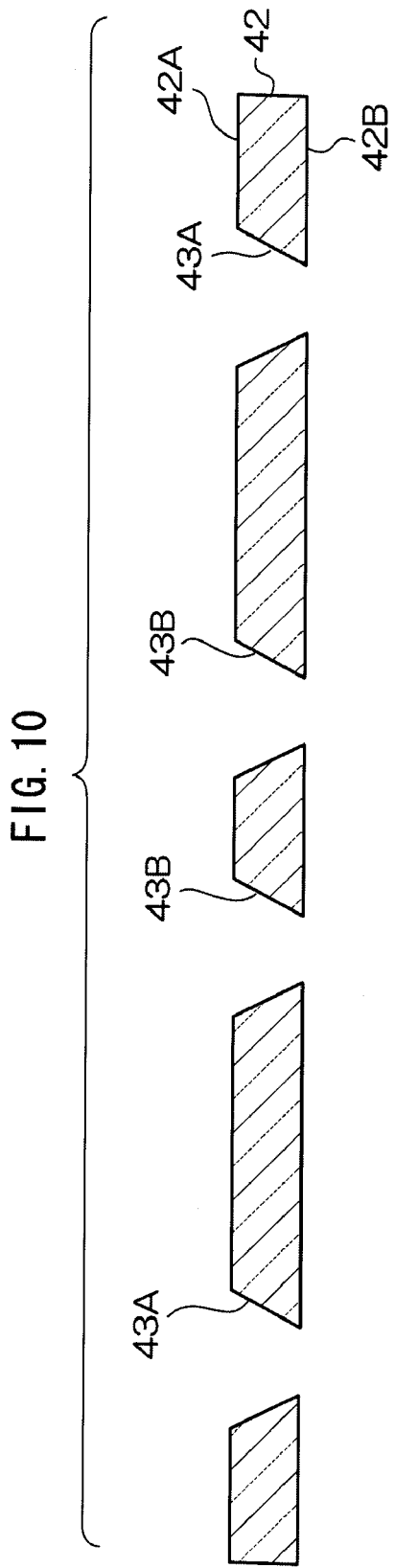

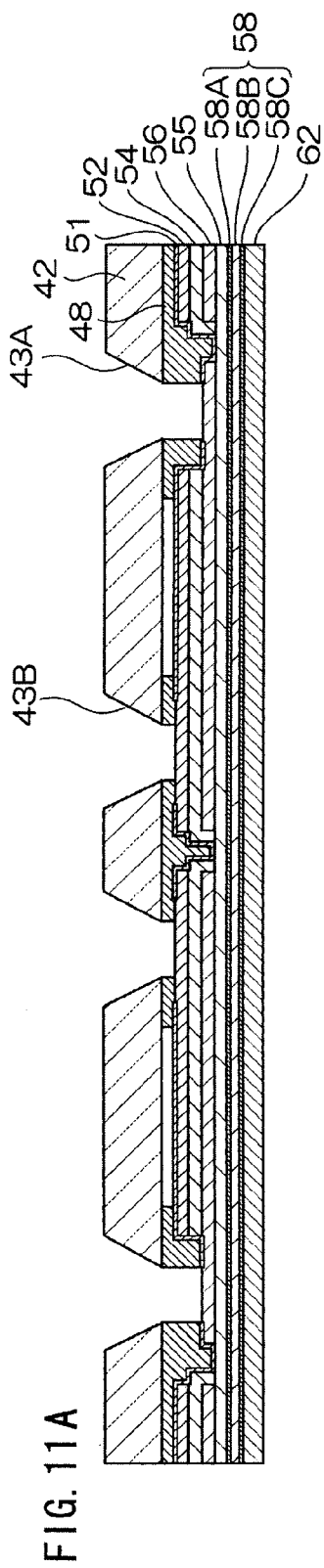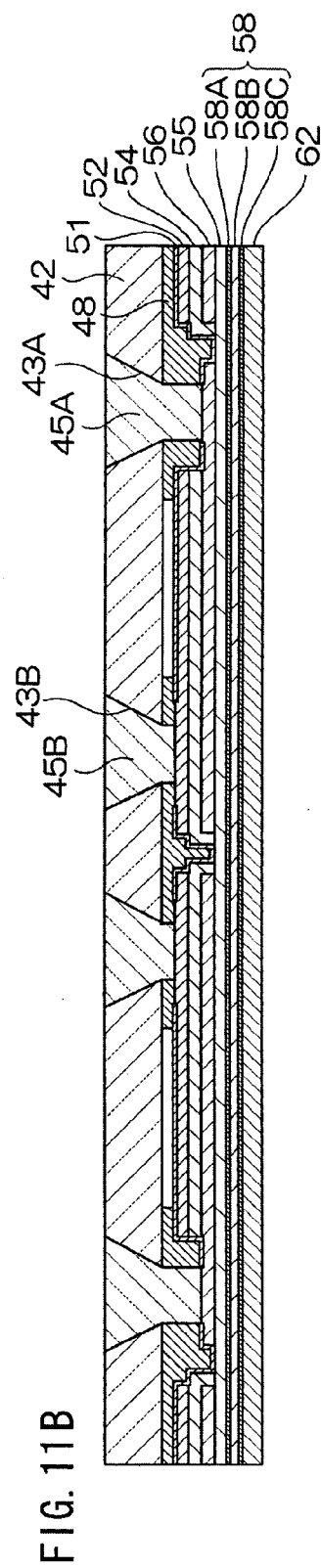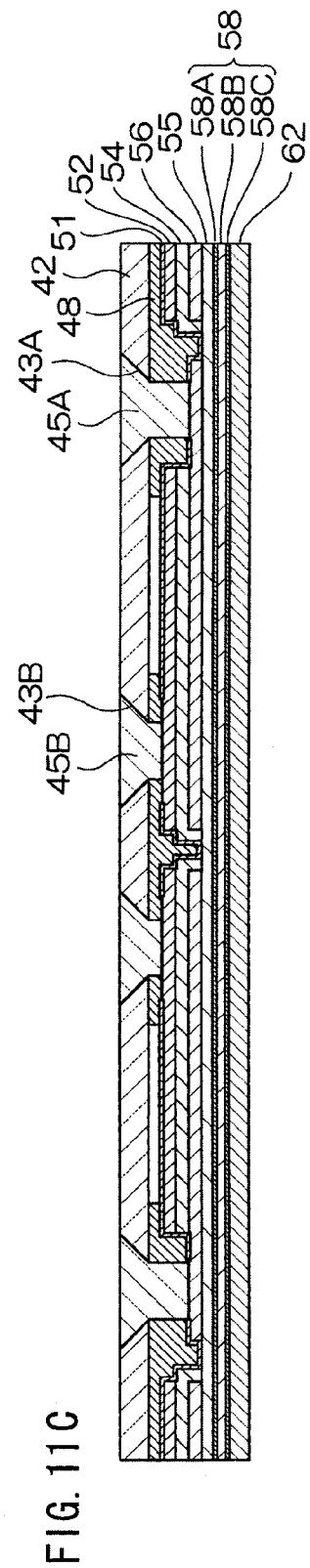

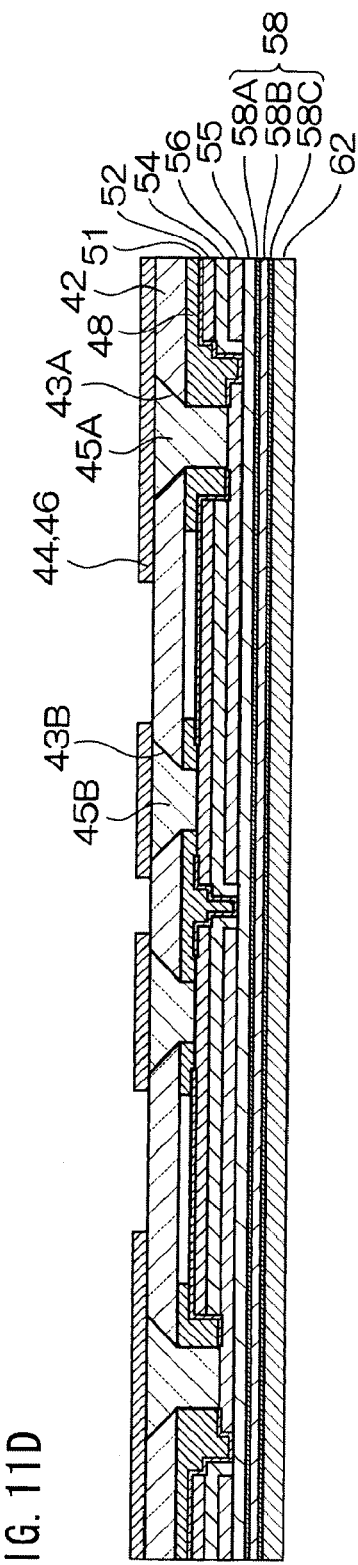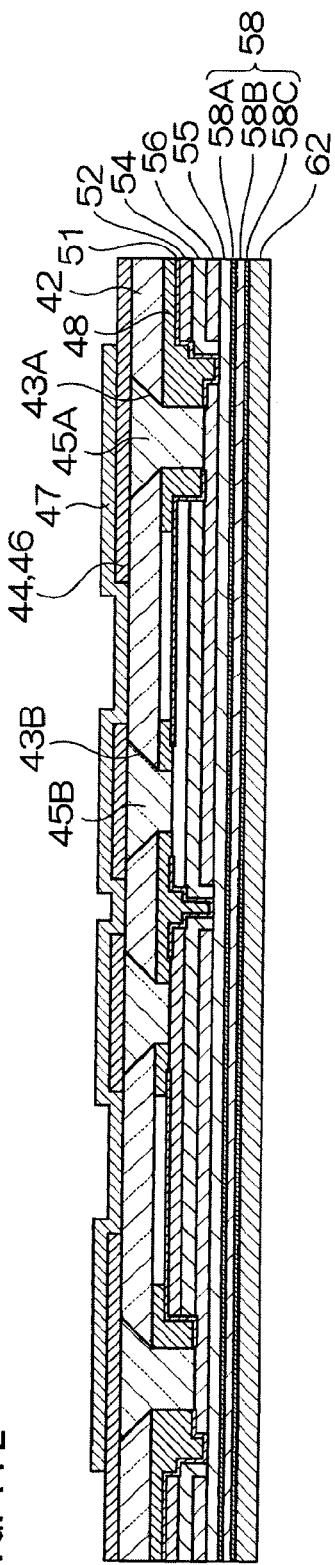

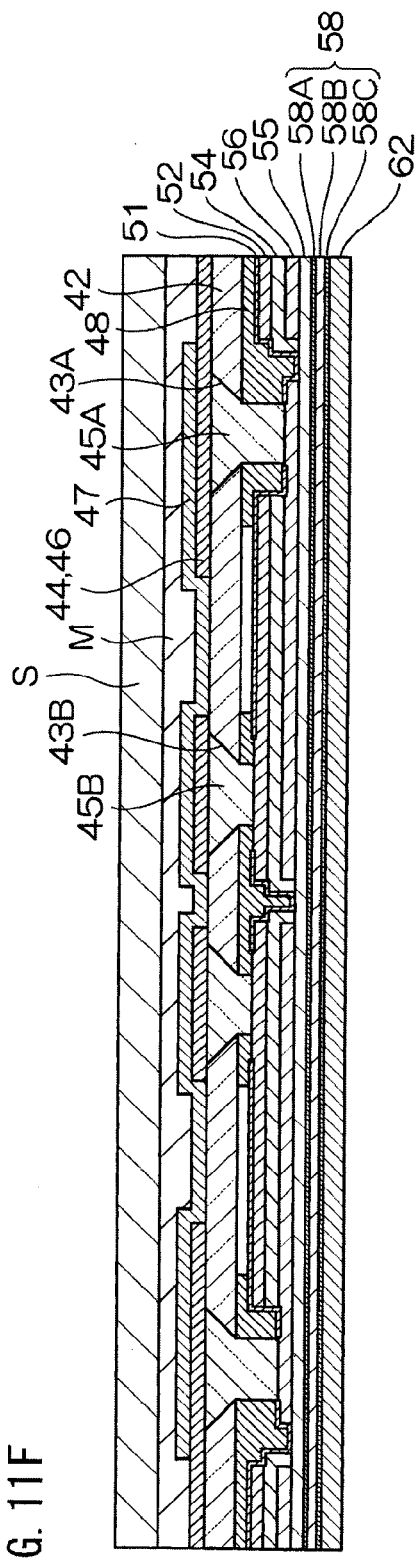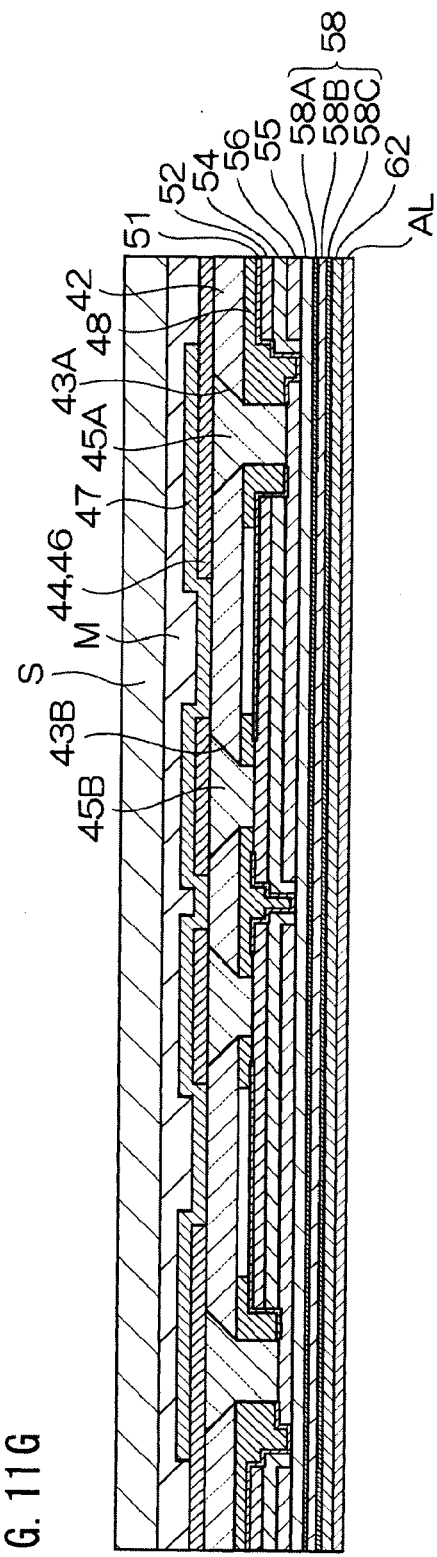

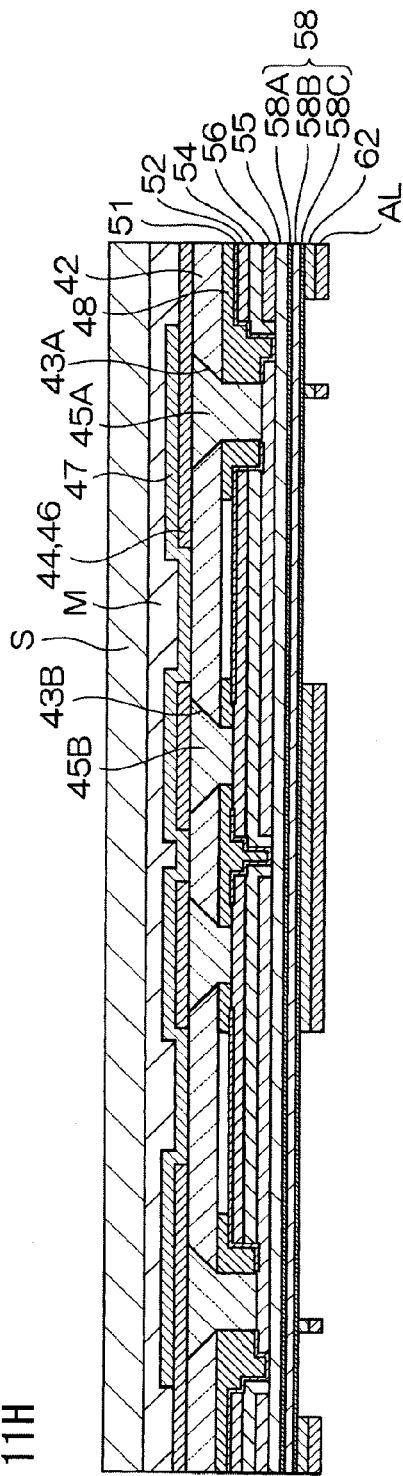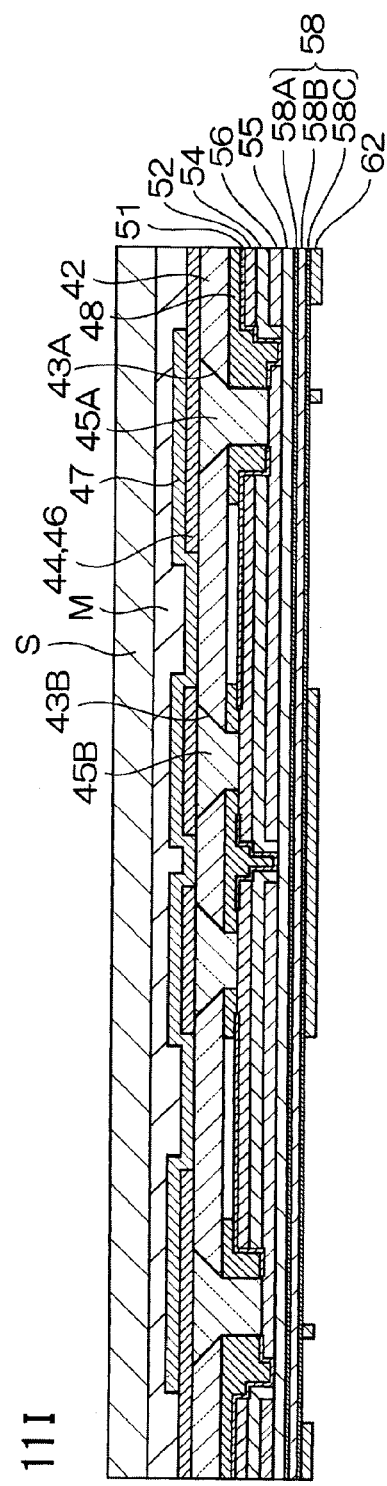

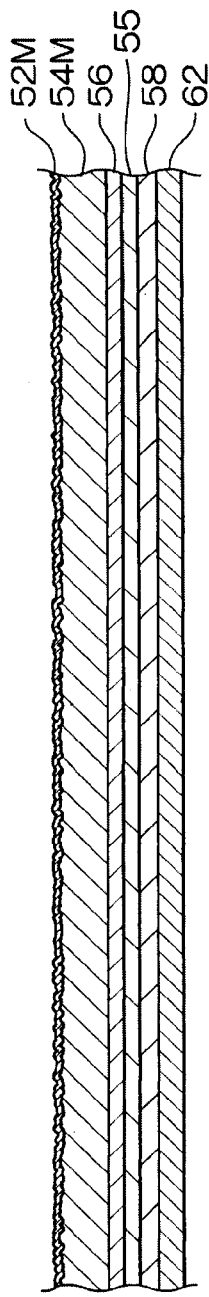
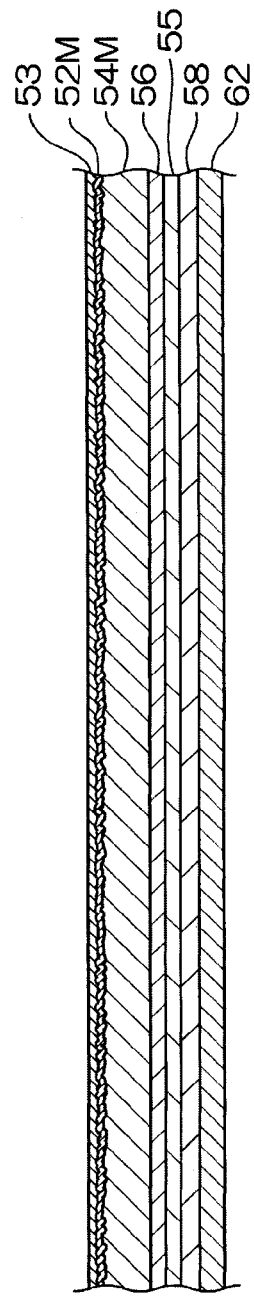
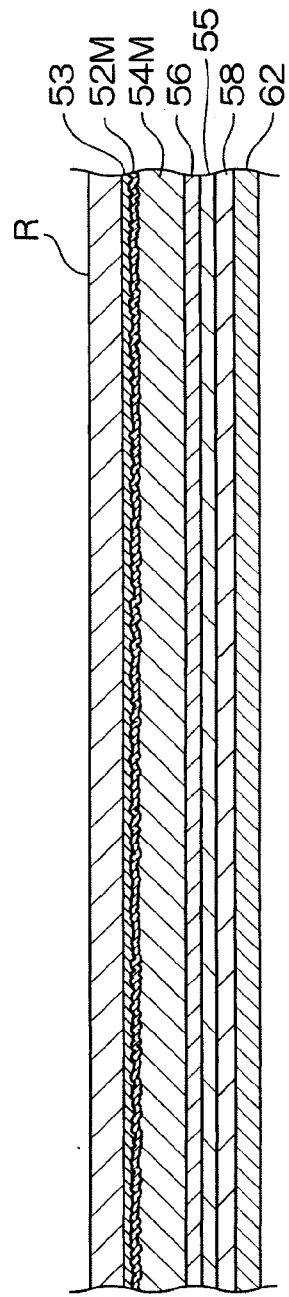
FIG. 18A
FIG. 18B
FIG. 18C

PIEZOELECTRIC ELEMENT SUBSTRATE, LIQUID DROPLET EJECTING HEAD, LIQUID DROPLET EJECTING DEVICE, AND PIEZOELECTRIC ELEMENT SUBSTRATE MANUFACTURING METHOD

CROSS-REFERENCE TO RELATED APPLICATION

This application is based on and claims priority under 35 USC 119 from Japanese Patent Application No. 2008-038775 filed Feb. 20, 2008.

BACKGROUND

1. Technical Field

The present invention relates to a piezoelectric element substrate, a liquid droplet ejecting head for ejecting liquid droplets such as ink, which is constituted by using this piezoelectric element substrate, a liquid droplet ejecting device provided with this liquid droplet ejecting head, and a manufacturing method for the piezoelectric element substrate.

2. Related Art

An ink-jet recording device (a liquid droplet ejecting device) for selectively ejecting ink droplets from plural nozzles of an ink-jet recording head as an example of a liquid droplet ejecting head to record an image (including a character) in a record medium such as recording paper has been conventionally known.

SUMMARY

According to an aspect of the present invention, there is provided a piezoelectric element substrate including a support substrate, an insulating orientation auxiliary layer formed on the support substrate, a lower electrode layer formed on the orientation auxiliary layer so that an uncoated portion where the orientation auxiliary layer is not coated with the lower electrode layer is constituted at at least a portion thereof, a piezoelectric substance layer formed on the lower electrode layer and the uncoated portion of the orientation auxiliary layer, and an upper electrode layer formed on the piezoelectric substance layer; wherein the orientation auxiliary layer and the piezoelectric substance layer comprise a material of the same crystal system.

BRIEF DESCRIPTION OF THE DRAWINGS

Exemplary embodiments of the present invention will be described in detail based on the following figures, wherein:

FIG. 7A is a magnified cross-sectional view of a part of a piezoelectric element member;

FIG. 7B is a magnified cross-sectional view of a part of a piezoelectric element member with no orientation auxiliary layer;

FIGS. 9A to 9H are explanatory views showing the process for manufacturing a piezoelectric element member on a pressure chamber substrate according to the first exemplary embodiment;

FIG. 10 is an explanatory view showing the process for manufacturing a top board member according to the first exemplary embodiment;

FIGS. 11A to 11M are explanatory views showing the process after joining a top board member on a piezoelectric element member according to the first exemplary embodiment;

DETAILED DESCRIPTION

A First Exemplary Embodiment

A first exemplary embodiment of the present invention is hereinafter described in detail based on Figs. A liquid droplet ejecting device is described by taking an ink-jet recording device 10 for an example thereof. Accordingly, ink 100 is regarded as liquid and an ink-jet recording head 32 is regarded as a liquid droplet ejecting head.

Figure 1:
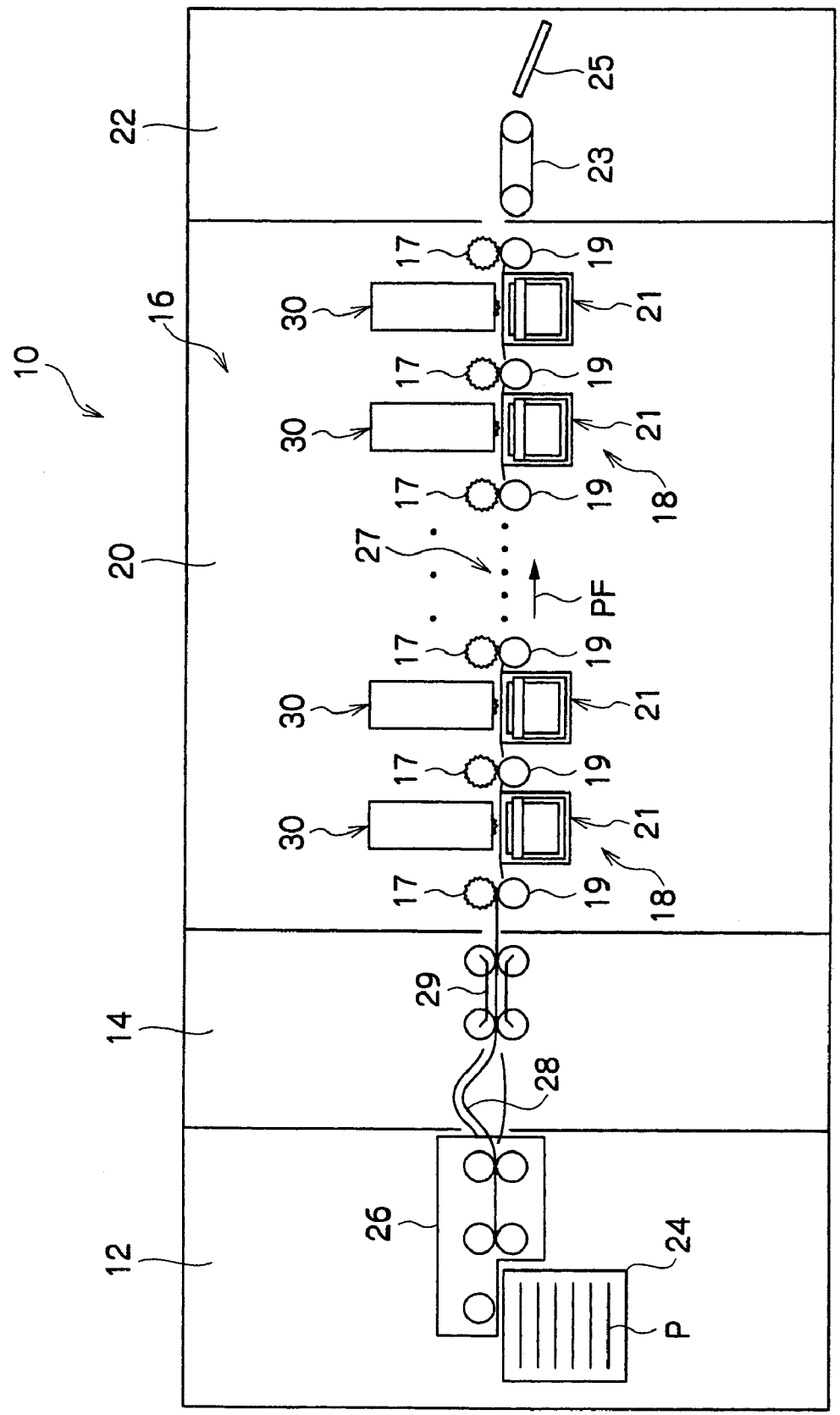
FIG. 1 is a schematic front view showing an ink-jet recording device.

The ink-jet recording device 10, as shown in FIG. 1, is basically composed of a paper supply unit 12 for feeding out recording paper P, a registration adjustment unit 14 for controlling a position of the recording paper P, a recording unit 20 provided with a recording head unit 16 for ejecting ink droplets to form an image on the recording paper P and a maintenance unit 18 for performing maintenance of the recording head unit 16, and a discharge unit 22 for discharging the recording paper P on which an image was formed in the recording unit 20.

The paper supply unit 12 is composed of a stocker 24 for forming and stocking the recording paper P, and a conveying device 26 for taking one by one sheet out of the stocker 24 to convey it to the registration adjustment unit 14. The registration adjustment unit 14 has a loop forming unit 28 and a guide member 29 for controlling a position of the recording paper P, whose skew is reformed with the utilization of stiffness thereof by passing through this unit, and the recording paper P is supplied to the recording unit 20 while conveying timing is controlled. Then, the discharge unit 22 stores the recording paper P, on which an image was formed in the recording unit 20, in a tray 25 through a paper discharge belt 23.

A paper conveying path 27 for conveying the recording paper P is constituted between the recording head unit 16 and the maintenance unit 18 (the paper conveying direction is denoted by the arrow PF). The paper conveying path 27 has a star wheel 17 and a conveying roll 19, which convey the recording paper P continuously (without stopping) while holding therebetween. Then, ink droplets are ejected from the recording head unit 16 to this recording paper P and an image is formed on the recording paper P. The maintenance unit 18 has a maintenance device 21 disposed opposite to an ink-jet recording unit 30 to perform processes such as capping, wiping, dummy jet and vacuum for the ink-jet recording unit 30.

Figure 2:
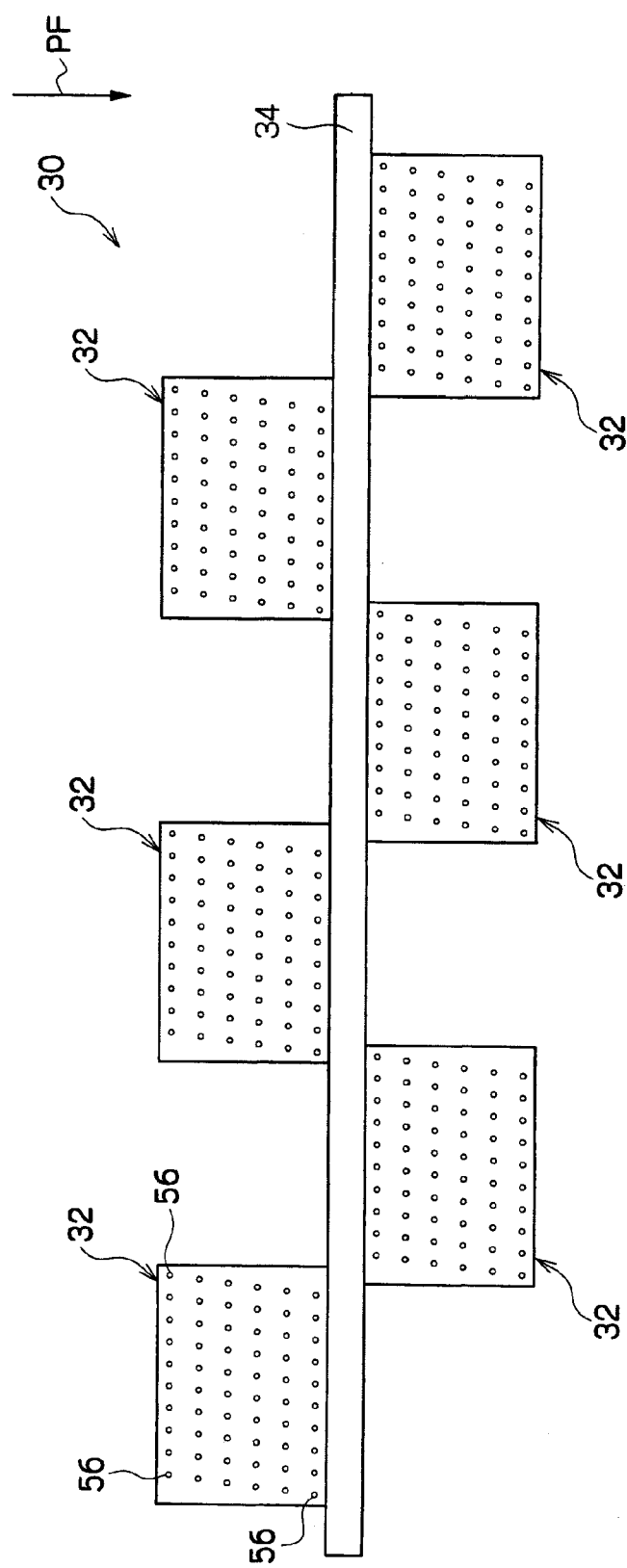
FIG. 2 is an explanatory view showing the array of ink-jet recording heads.

As shown in FIG. 2, each of the ink-jet recording units 30 is provided with a support member 34 disposed in the direction orthogonal to the paper conveying direction denoted by the arrow PF. The plural ink-jet recording heads 32 are installed in the support member 34. Plural nozzles 56 are formed in the ink-jet recording head 32 in a matrix state and the nozzles 56 are juxtaposed in the width direction of the recording paper P at a constant pitch as the whole ink-jet recording unit 30.

Then, ink droplets are ejected from the nozzles 56 to the recording paper P continuously conveyed in the paper conveying path 27, whereby an image is recorded on the recording paper P. At least four ink-jet recording units 30 are disposed correspondingly to each color of yellow (Y), magenta (M), cyan (C) and black (K) for recording the so-called image in full color, for example.

Figure 3:
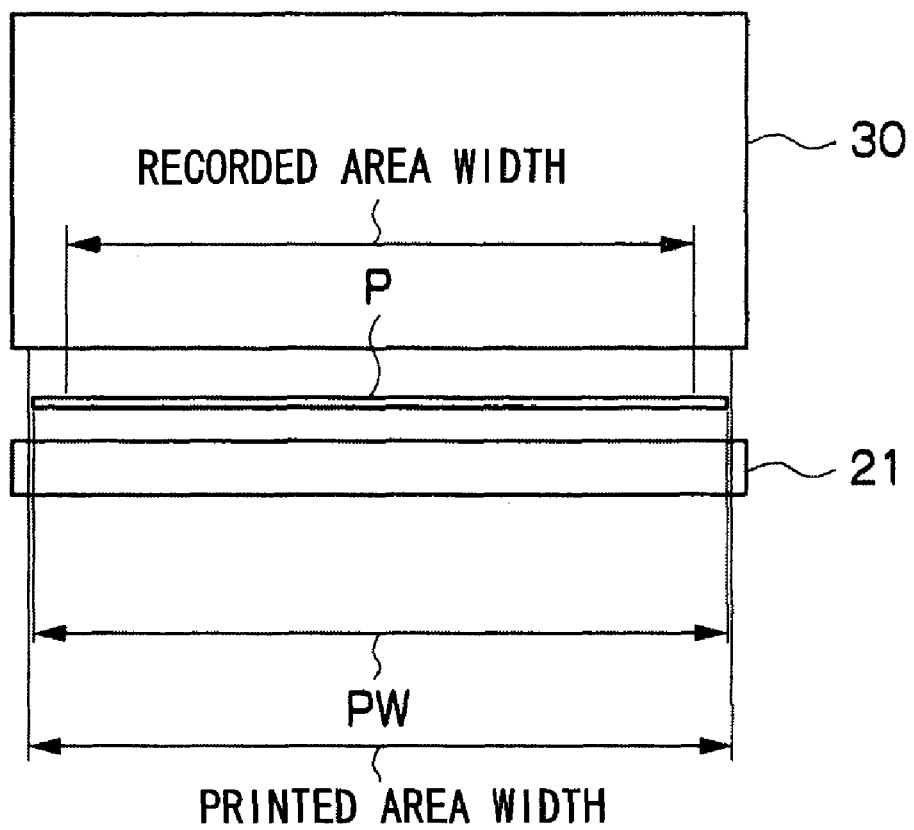
FIG. 3 is an explanatory view showing the relation between the width of a record medium and the width of a printed area.

As shown in FIG. 3, printed area width by the nozzles 56 of each of the ink-jet recording units 30 is determined longer than paper maximum width PW of the recording paper P on which it is assumed that an image is recorded in this ink-jet recording device 10, and an image may be recorded over the overall width of the recording paper P without moving the ink-jet recording unit 30 in the paper width direction.

Here, the printed area width is based on the maximum of recorded areas such that an unprinted margin is subtracted from both ends of the recording paper P, and yet generally determined longer than the paper maximum width PW to be printed on. The reason therefor is that there is a possibility that the recording paper P is conveyed with inclination (skew) of a predetermined angle to the conveying direction, and borderless printing is greatly desired.

Figure 4:
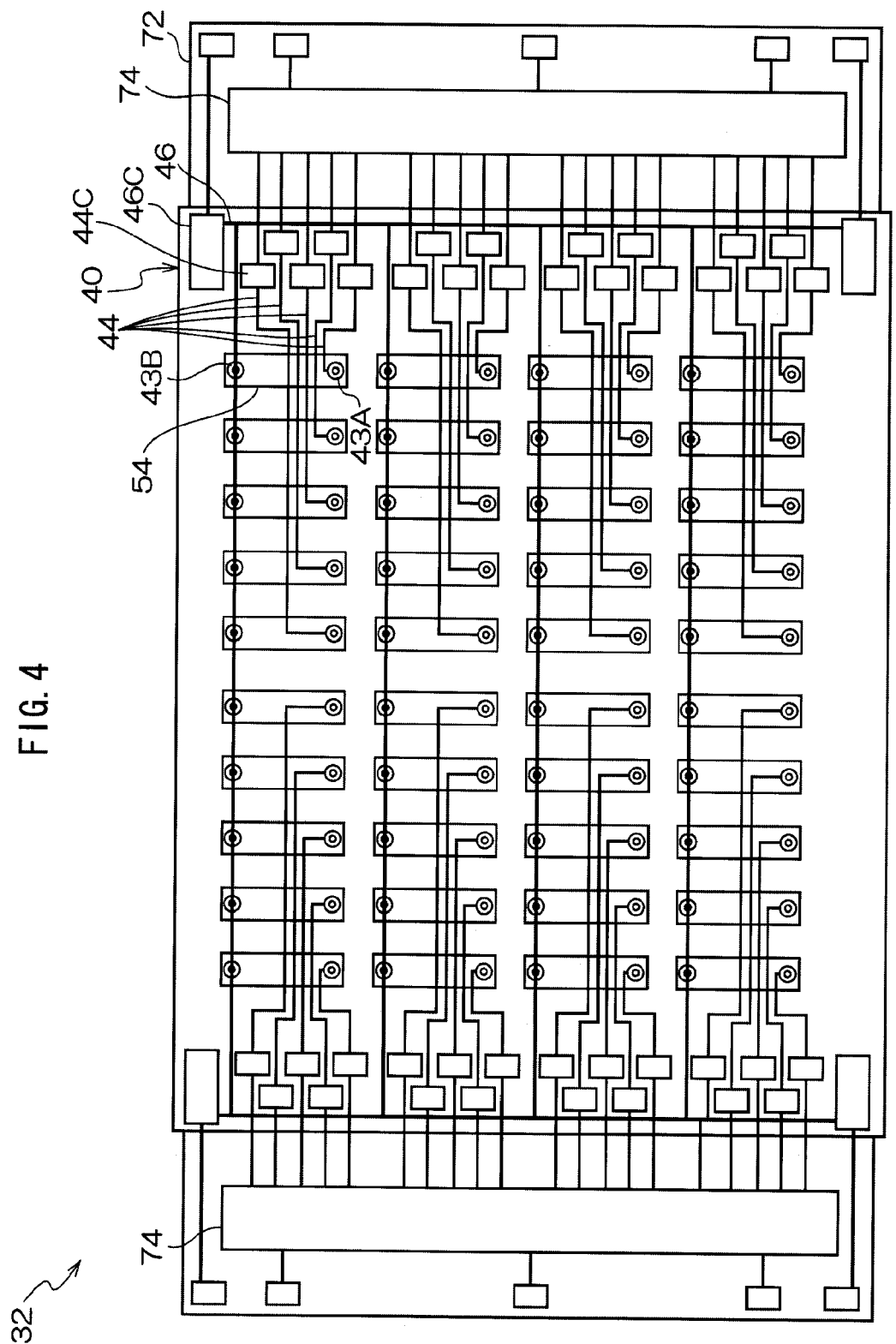
FIG. 4 is a schematic plan view showing the entire configuration of an ink-jet recording head.
Figure 5:
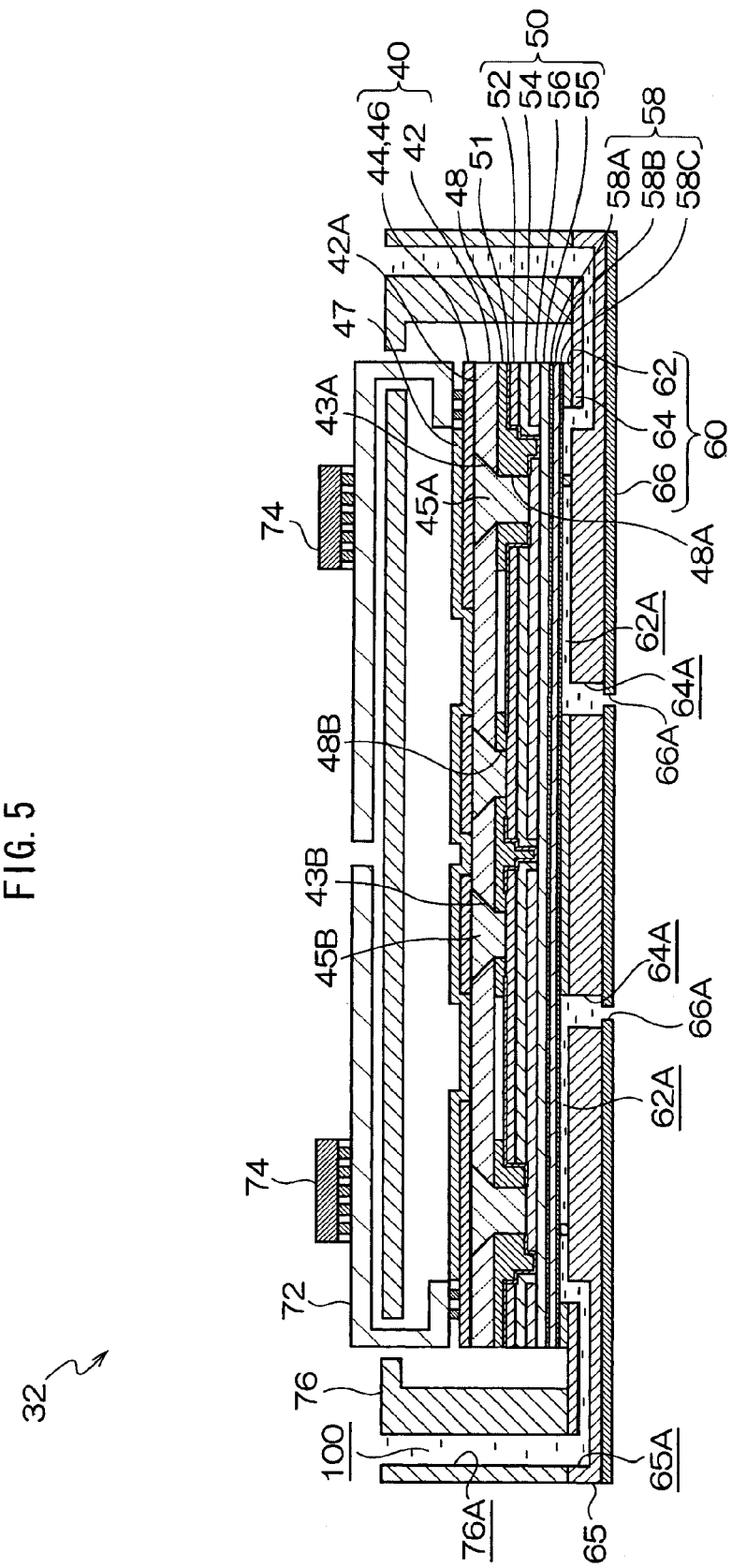
FIG. 5 is a schematic cross-sectional view showing the configuration of an ink-jet recording head of a first exemplary embodiment.

In the ink-jet recording device 10 constituted as the above, the ink-jet recording head 32 is described next in detail. FIG. 4 is a schematic plan view showing the entire configuration of the ink-jet recording head 32. FIG. 5 is a schematic cross-sectional view definitely showing the main part by partially taking out the ink-jet recording head 32 of the exemplary embodiment.

As shown in FIG. 5, the ink-jet recording head 32 is provided with a top board member 40, a piezoelectric element member 50, a diaphragm 58 and a flow path member 60.

The top board member 40 is composed of a top board 42, a discrete wiring 44 and a GND wiring 46. The top board 42 is tabular and may be composed of an insulator having strength capable of becoming a support for the ink-jet recording head 32, such as glass, ceramics, silicon and resin. Here, the top board 42 made of glass is described. The discrete wiring 44 and the GND wiring 46 are wired on a surface 42A of the top board 42.

Figure 6A:
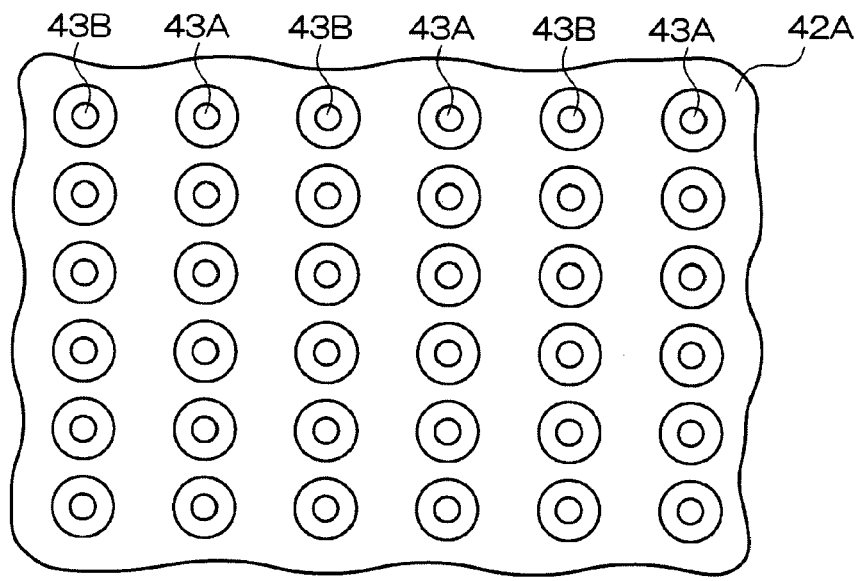
FIG. 6A is a schematic configuration top view of a part of a top board member.
Figure 6B:
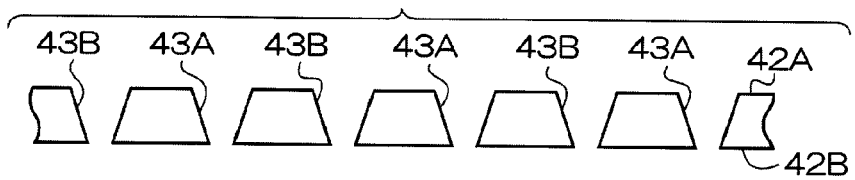
FIG. 6B is a schematic configuration cross-sectional view of a part of a top board member.
Figure 6C:
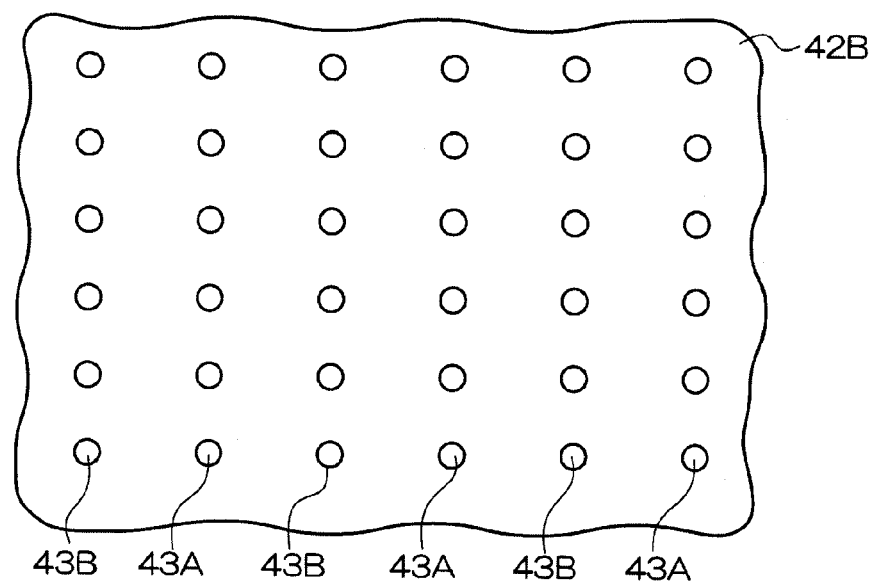
FIG. 6C is a schematic configuration bottom view of a part of a top board member.

The top board 42, as shown in FIGS. 6A, 6B and 6C, has a first through hole 43A and a second through hole 43B in a matrix state. The first through hole 43A and the second through hole 43B are alternately disposed in rows. As shown in FIG. 5, one end of the discrete wiring 44 is connected to a lower electrode 56 of the after-mentioned piezoelectric element member 50 through a first conductive member 45A which is filled into the first through hole 43A. The other end of the discrete wiring 44, as shown in FIG. 4, is pulled out in the vicinity of the end of the top board 42 from the first through hole 43A, and connected to a connecting terminal 44C. The discrete wiring 44 and one end of a flexible print-circuit board (FPC) 72 are connected by the connecting terminal 44C and the other end of the flexible print-circuit board 72 is connected to a drive IC 74.

The GND wiring 46 is connected to an upper electrode 52 of the after-mentioned piezoelectric substance 54 through a second conductive member 45B filled into the second through hole 43B, and connected to a reference potential terminal 46C. The discrete wiring 44 and the GND wiring 46 wired on the surface 42A are coated and protected with a resin protective film 47.

The piezoelectric element member 50 is constituted so that the upper electrode 52, the piezoelectric substance 54, the lower electrode 56 and the diaphragm 58 are formed in this order. The piezoelectric element member 50 is disposed so that the upper electrode 52 side is separately opposed to the top board member 40. The piezoelectric substance 54 is divided into plural pieces and respective pieces of the piezoelectric substance 54 are separated from one another. The respective pieces of the piezoelectric substance 54 are individually disposed at a location corresponding to each of the after-mentioned pressure chambers 62A and separated from one another so as not to cover at least a part of a portion where the lower electrode 56 is not disposed (an uncoated portion 54E). PZT and the like may be used as materials for the piezoelectric substance 54.

The upper electrode 52 is formed on the top board member 40 side of each of the piezoelectric substances 54. The lower electrode 56 is formed on the opposite side of the upper electrode 52 formed on each of the piezoelectric substances 54. The lower electrode 56 is individually disposed at a location corresponding to each of the after-mentioned pressure chambers 62A, and the adjacent lower electrodes 56 are separated. The materials of noble metal such as $BaRuO_3$, $SrUrO_3$ and the like, and the materials of conducting metal oxide such as Iridium (Ir), platinum (Pt) and the like of the same crystal system as the piezoelectric substance 54 may be used as materials for the lower electrode 56. The use of the materials of the same crystal system as the piezoelectric substance 54 allows orientation property of the formed piezoelectric substance 54 to be improved.

The diaphragm 58 as a support substrate is disposed on the lower side of the piezoelectric element member 50, and an orientation auxiliary layer 55 is formed between the diaphragm 58 and the lower electrode 56. The detail of the orientation auxiliary layer 55 is described later.

The diaphragm 58 has a three-layer structure such that $SiO_2$ films 58A and 58C with no impurities added are formed above and below a silicon oxide film ($SiO_2$ film) 58B with germanium (Ge) added by a Plasma-Chemical Vapor Deposition (P-CVD) method, which diaphragm 58 has elasticity at least in the vertical direction and is constituted so as to offer flexure deformation (displacement) in the vertical direction in electrifying (impressing voltage on) the piezoelectric substance 54. The thickness of the diaphragm 58 is determined at 1 μm or more and 20 μm or less (1 μm to 20 μm) for obtaining stable rigidity. The diaphragm 58 composes one plane of the after-mentioned pressure chamber 62A.

FIG. 7A shows a magnified configuration view of the piezoelectric element member 50, the orientation auxiliary layer 55 and the diaphragm 58. The orientation auxiliary layer 55 is formed on the whole surface of the diaphragm 58. The materials of the same crystal system as the piezoelectric substance 54, having insulating properties and capable of orientating the piezoelectric substance 54, such as $SrTiO_3$ and $PbTiO_3$, may be used as materials for the orientation auxiliary layer 55. With regard to a portion with no lower electrode 56 disposed (an uncoated portion 54E), the use of the materials of the same crystal system as the piezoelectric substance 54 allows orientation property of the piezoelectric substance 54 to be improved.

In the case where the orientation auxiliary layer 55 is not formed, as shown in FIG. 7B, the piezoelectric substance 54 is disposed on the diaphragm 58 in the uncoated portion 54E, so that dielectric breakdown, crack and exfoliation of the piezoelectric substance 54 are easily caused.

The upper side of the upper electrode 52 is coated with a low permeability insulating film (hereinafter referred to as "SiOx51"), and a partition wall member 48 is disposed between the piezoelectric element member 50 and the top board member 40. The partition wall member 48 is constituted so that each of the piezoelectric substances 54 and the lower electrode 56 are partitioned and space is constituted between a portion corresponding to the piezoelectric substance 54 and the top board member 40.

The partition wall member 48 has a first partition wall hole 48A for connecting the first conductive member 45A and the lower electrode 56 as well as a second partition wall hole 48B for connecting the second conductive member 45B and the upper electrode 52 at locations corresponding to the first through hole 43A and the second through hole 43B. The first conductive member 45A is filled into the first through hole 43A and the first partition wall hole 48A, and electrically connects the discrete wiring 44 and the lower electrode 56. The second conductive member 45B is filled into the second through hole 43B and the second partition wall hole 48B, and electrically connects the GND wiring 46 and the upper electrode 52.

The flow path member 60 is composed of a pressure chamber substrate 62, a communicating path substrate 64 and a nozzle substrate 66. The pressure chamber substrate 62 is disposed on the lower side of the diaphragm 58, and positions thereof corresponding to the respective piezoelectric substance 54 are penetrated, whereby pressure chambers 62A partitioned by the diaphragm 58 and penetration walls of the pressure chamber substrate 62 are configured. The ink 100 supplied from the ink supply port 65A described below is filled into the pressure chamber 62A.

The communicating path substrate 64 is formed on the lower side of the pressure chamber substrate 62 and has a communicating path 64A for communicating the pressure chamber 62A and the after-mentioned nozzle 66A. The nozzle substrate 66 is formed on the lower side of the communicating path 64A. The nozzle substrate 66 has the nozzle 66A for ejecting ink droplets in a matrix state, and each of the nozzles 66A communicated to each of the communicating paths 64A. The vibration of the diaphragm 58 increases and decreases capacity of the pressure chamber 62A to cause pressure waves, so that ink droplets may be ejected from the nozzle 66A.

An ink supply unit 65 having the ink supply port 65A is formed at a projecting location along the plane direction of the piezoelectric element member 50 in the peripheral edges of the communicating path substrate 64. The ink supply unit 65 is provided with a manifold 76 for covering the top board member 40 and the piezoelectric element member 50, and the manifold 76 has an ink path 76A on extension of the ink supply port 65A. The ink path 76A is connected to an ink tank not shown in Fig., and the ink 100 is supplied to the pressure chamber 62A through the ink path 76A and the ink supply port 65A.

In the ink-jet recording head 32 constituted as the above, manufacturing steps (manufacturing processes) thereof are described next in detail based on FIGS. 8 to 11M.

Figure 8:
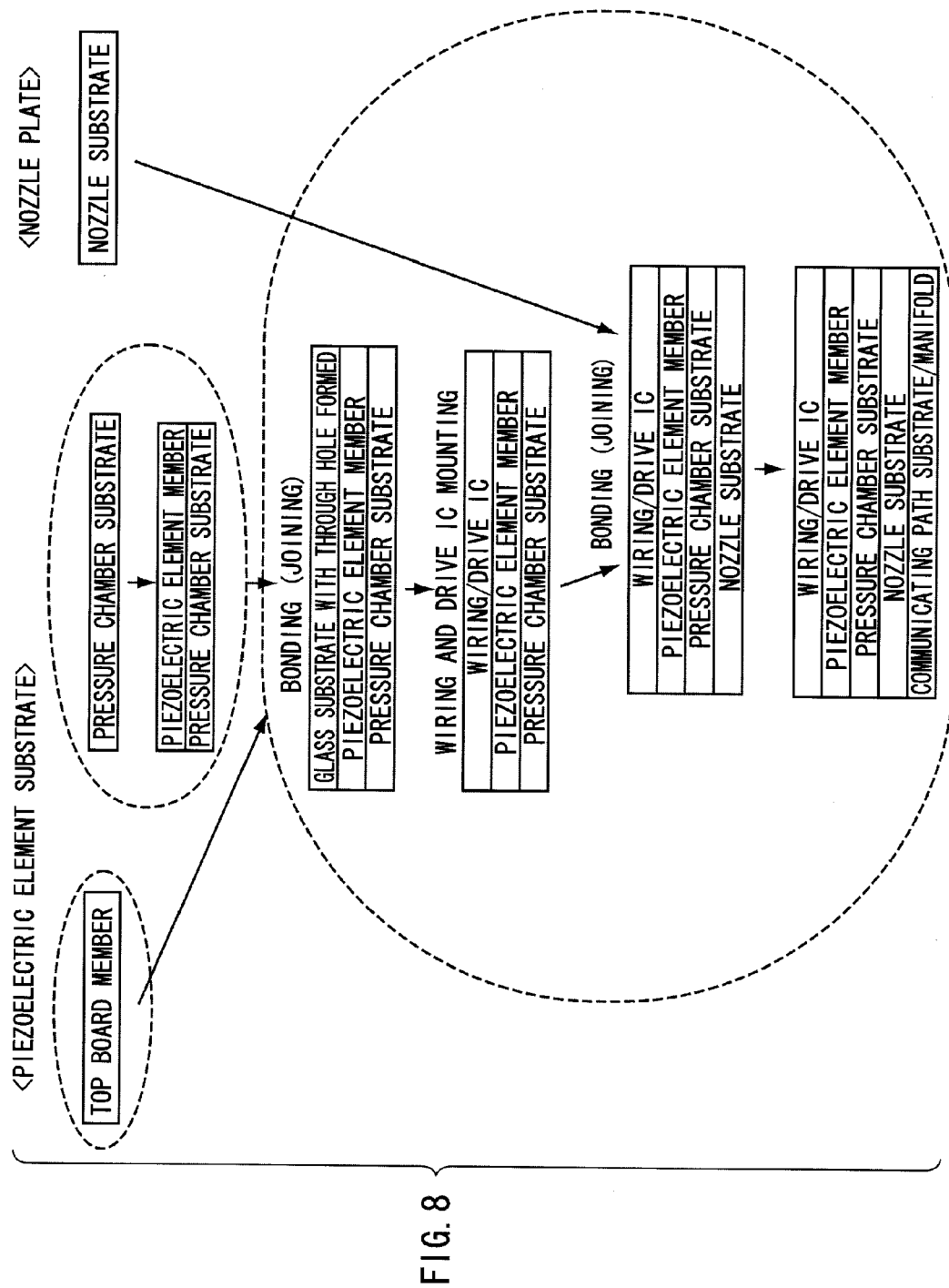
FIG. 8 is an explanatory view of the entire process for manufacturing an ink-jet recording head.

As shown in FIG. 8, this ink-jet recording head 32 is manufactured in such a manner that the piezoelectric element member 50 is produced on the upper face of the pressure chamber substrate 62 as a substrate composing the flow path member 60, and thereafter the top board member 40 is disposed on the upper face of the pressure chamber substrate 62, and then the communicating path substrate 64 and the nozzle substrate 66 are joined (stuck) to the lower face of the pressure chamber substrate 62.

As shown in FIG. 9A, the pressure chamber substrate 62 is prepared, and a thin film as a part of the diaphragm 58, that is, an $SiO_2$ film 58C with no impurities added (a film thickness of 0.4 μm) is formed on the upper face thereof by P-CVD method, and subsequently another thin film as a part of the diaphragm 58, that is, an $SiO_2$ film 58B with Ge added (a film thickness of 9.2 μm) is formed thereon by P-CVD method, and further, as shown in FIG. 9B, another thin film as a part of the diaphragm 58, that is, an $SiO_2$ film 58A with no impurities added (a film thickness of 0.4 μm) is formed thereon by P-CVD method.

Specifically, the thin films are formed by adding tetramethyl germanium (TMGe) as alkoxide gas to gas containing oxygen ($O_2$) and silicon (Si) materials, such as gas containing any of tetraethoxysilane (TEOS), tetramethoxysilane (TMOS) and silane ($SiH_4$). Then, the thickness of the $SiO_2$ film 58B with Ge added is determined at ½ or more the thickness of the whole diaphragm 58.

Thus, the $SiO_2$ films 58A, 58B and 58C are continuously formed and then annealed (heat-treated) under an atmosphere of nitrogen ($N_2$) for 1 hour at higher temperature than the maximum temperature in the processes hereafter, such as 700° C. The annealing at 700° C. increases stress value of the diaphragm 58 by several tens MPa; however, the annealing once allows the stress not to be shifted any further. The annealing temperature is not limited to 700° C. but may be 600° C. or more and 1100° C. or less (600° C. to 1100° C.).

The $SiO_2$ films 58A, 58B and 58C are formed and annealed to form the diaphragm 58 with a three-layer structure, and then form the orientation auxiliary layer 55 on a layer of the diaphragm 58 as shown in FIG. 9C. The orientation auxiliary layer 55 may be formed by a sputtering method, for example.

Next, as shown in FIG. 9D, a formed film of Ir and Ti having a thickness of approximately 0.5 μm, that is, the lower electrode 56, is formed on the upper face of the diaphragm 58

(the SiO$_2$ film 58A) by a sputtering method. Then, as shown in FIG. 9E, the lower electrode 56 formed on the upper face of the diaphragm 58 is patterned. Specifically, the process includes: resist formation by a photolithography method, patterning, dry etching by an RIE method (using Cl$_2$ gas) and resist stripping by oxygen plasma. In the patterning of this lower electrode 56, the diaphragm 58 is occasionally shaven deeply by dry etching due to being composed of the SiO$_2$ films 58A, 58B and 58C; however, the formation of the orientation auxiliary layer 55 in the present exemplary embodiment may restrain shaving of the diaphragm 58.

Figure 9F:
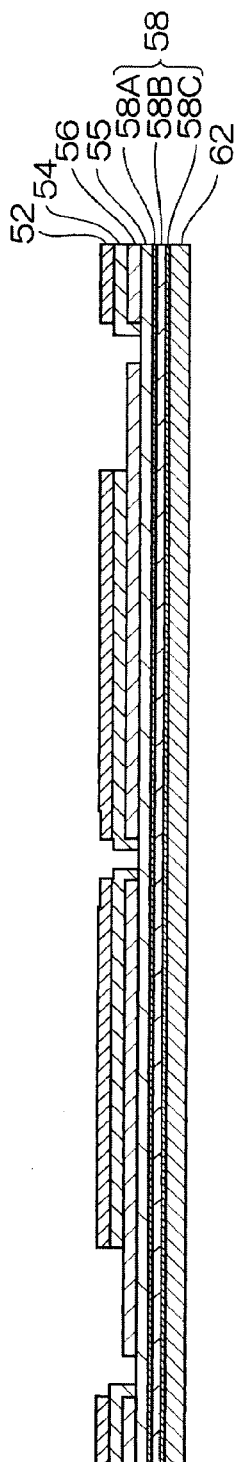

Then, as shown in FIG. 9F, a PZT film as a material for the piezoelectric substance 54 and an Ir film as the upper electrode 52 are sequentially formed by a sputtering method as a thin-film forming method, and patterned to configure the piezoelectric substance 54 and the upper electrode 52 on the upper face of the patterned lower electrode 56.

Specifically, the manner is as follows: PZT film sputtering (a film thickness of 5 μm), Ir film sputtering (a film thickness of 0.5 μm), resist formation by a photolithography method, patterning (dry etching using Cl$_2$ or F gas) and resist stripping by oxygen plasma. Examples of materials for the lower and upper electrodes include Ir, Au, Ru, Pt, Ta, PtO$_2$, TaO$_4$ and IrO$_2$ having high affinity for PZT material as a piezoelectric substance and heat resistance. The film-forming temperature of a PZT film 54F may be 550° C., and AD method and sol-gel method may be also used for forming the PZT film 54F.

Figure 9G:
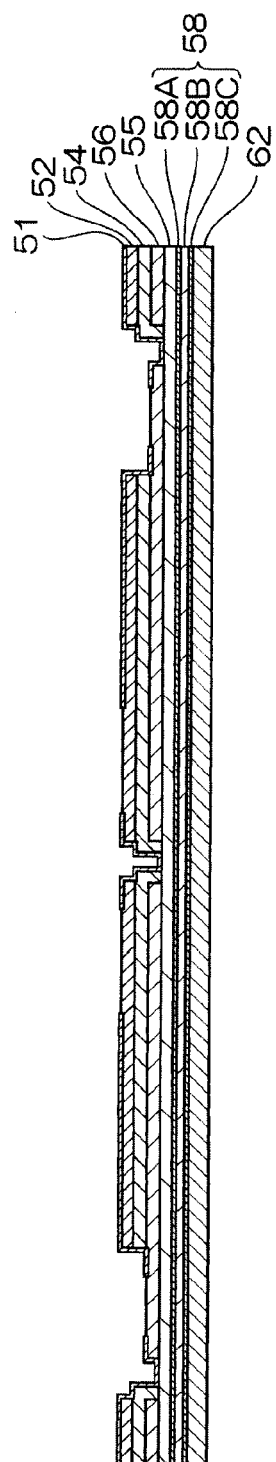

Next, as shown in FIG. 9G, an SiOx film 51 as a protective film is formed on the upper face of the lower electrode 56 exposed upward, the upper electrode 52 (the piezoelectric substance 54) and the orientation auxiliary layer 55 shaven partially. Then, an opening 80A (a contact hole) for connecting the upper electrode 52 and the second conductive member 45B is formed. Specifically, the manner is as follows: formation of the SiOx film 51 by P-CVD method, resist formation by a photolithography method, patterning (wet etching by 20%-concentration HF solution or dry etching by gas containing HF) and resist stripping by oxygen plasma.

Here, the SiOx film 51 (silicon oxide film) is used as a protective film, which may be an SiNx film (silicon nitride film) and an SiOxNy film, and also SOG (Spin-On-Glass), metal films such as Ta and Ti, metal oxide films such as TaO$_2$ and Ta$_2$O$_5$ and resin film, and further not merely single-layer films thereof but also multi-layer films in combination of them. The oxide film, nitride film, SOG, metal films and metal oxide films are excellent in insulating properties, humidity resistance and level difference restraint (relaxation) between film layers; among them, the oxide film, nitride film, SOG and metal films are excellent also in chemical (ink) resistance. The resin film also is excellent in level difference restraint, and the oxide film, nitride film and SOG are excellent also in diffusion prevention of Ge (impurities) added to an SiO$_2$ film 82.

Figure 9H:
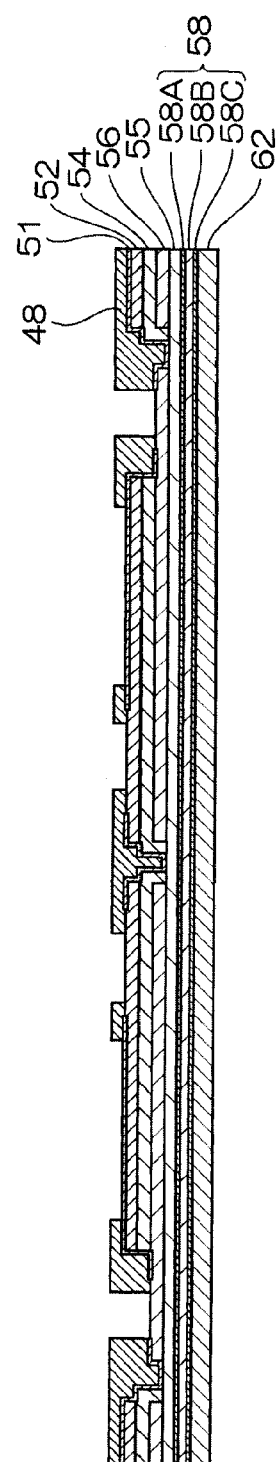

Subsequently, as shown in FIG. 9H, the partition wall member 48 is formed. The partition wall member 48 has the first partition wall hole 48A having approximately the same diameter as the diameter on the back face 42B side of the first through hole 43A of the after-mentioned top board 42, and the second partition wall hole 48B having approximately the same diameter as the diameter on the back face 42B side of the second through hole 43B thereof. Specifically, the manner is such that photosensitive resin composing the partition wall member 48 is applied to the SiOx film, exposed and developed to form a pattern, which is lastly cured. Examples of photosensitive resin to be used for composing the partition wall member 48 include polyimide, polyamide, epoxy, polyurethane and silicone.

Thus, the diaphragm 58 and the piezoelectric element member 50 are produced on the upper face of the pressure chamber substrate 62.

With regard to the manufacture of the top board member 40, as shown in FIG. 10, the top board 42 having thickness (0.3 mm to 1.5 mm) capable of securing as great strength as a support is prepared to make the first through hole 43A and the second through hole 43B in the top board 42.

Specifically, the manner is such that resist of a photosensitive dry film is patterned by a photolithography method to form an opening by performing sandblasting process with the use of this resist as a mask, and thereafter strip the resist by oxygen plasma. The first through hole 43A and the second through hole 43B are formed in a taper shape (a funnel shape) such that the inside face becomes gradually smaller diameter downward (from the surface 42A side toward the back 42B side) in being cross-sectionally observed.

Next, as shown in FIG. 11A, the top board member 40 is joined to the upper face of the piezoelectric element member 50. Then, the first through hole 43A and the second through hole 43B are disposed so as to be superposed on the first partition wall hole 48A and the second partition wall hole 48B, respectively.

Next, as shown in FIG. 11B, the first through hole 43A, the first partition wall hole 48A, the second through hole 43B and the second partition wall hole 48B are filled with conductive paste and regarded as the first conductive member 45A and the second conductive member 45B. Examples of conductive paste to be used include solder, molten metal, metal paste and conductive adhesive. Resistivity desired for these materials may be properly selected in consideration of costs and process matching (such as heat-resistant temperature) by reason of varying in accordance with properties required for elements.

Next, as shown in FIG. 11C, the upper side of the top board member 40, that is, the upper face of the top board 42, the first conductive member 45A and the second conductive member 45B is ground to flatten level difference from the conductive members.

Next, as shown in FIG. 11D, a wiring film is formed on the upper side of the top board member 40 to form the discrete wiring 44 and the GND wiring 46. Then, as shown in FIG. 11E, an SiOx film 47 as a protective film is formed so as to cover the upper side of the discrete wiring 44 and the GND wiring 46.

Next, as shown in FIG. 11F, a support plate S for manufacturing processes is adhered to the upper side of the top board member 40 through an interlayer M. Then, as shown in FIG. 11G, the lower face of the pressure chamber substrate 62 is ground to form an aluminum layer AL for patterning. The aluminum layer AL may be formed by an evaporation method such as sputtering.

Figure 11J:
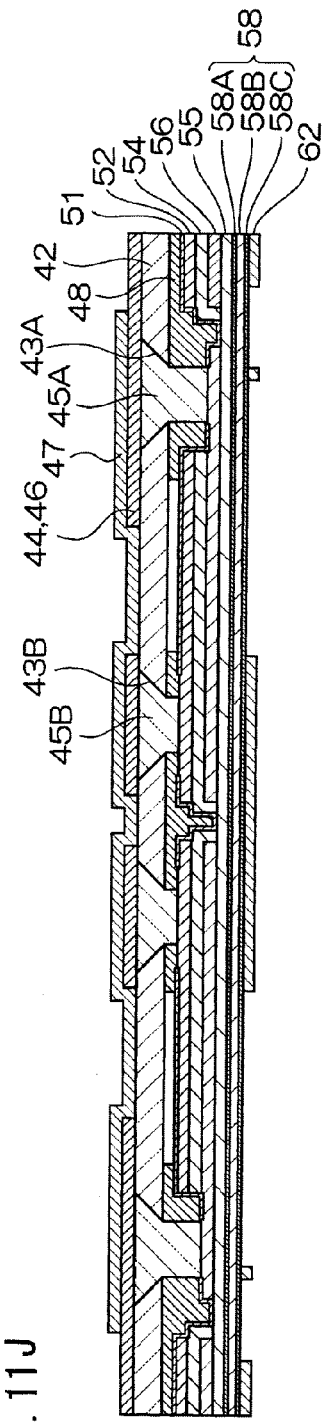

Next, as shown in FIG. 11H, the aluminum layer AL and the pressure chamber substrate 62 are etched to form the pressure chamber 62A and a path (not shown in Fig.) for communicating each of the pressure chambers 62A, and thereafter remove the aluminum layer AL (FIG. 11I) and remove the support plate S with the interlayer M (refer to FIG. 11J).

Figure 11K:
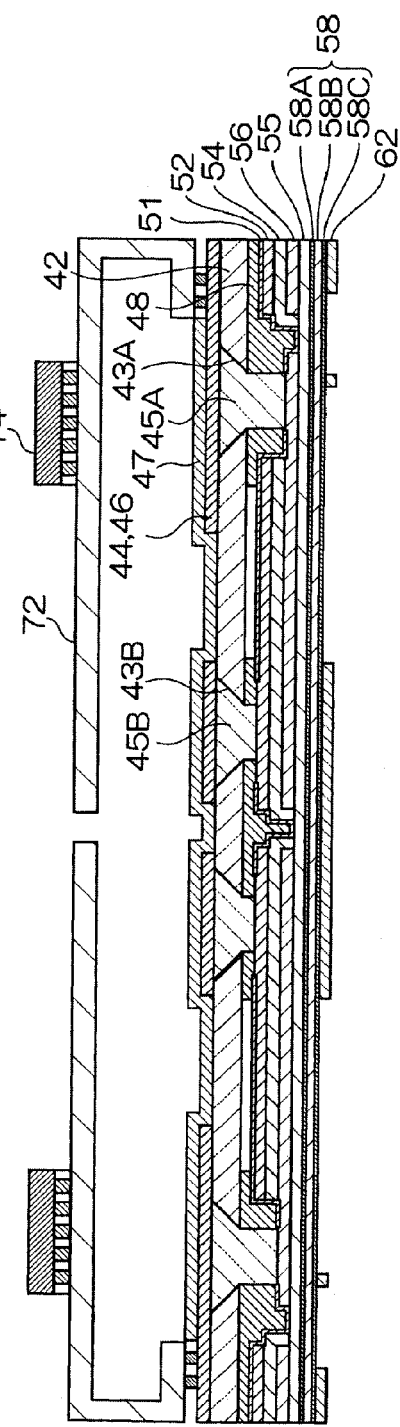
Figure 11L:
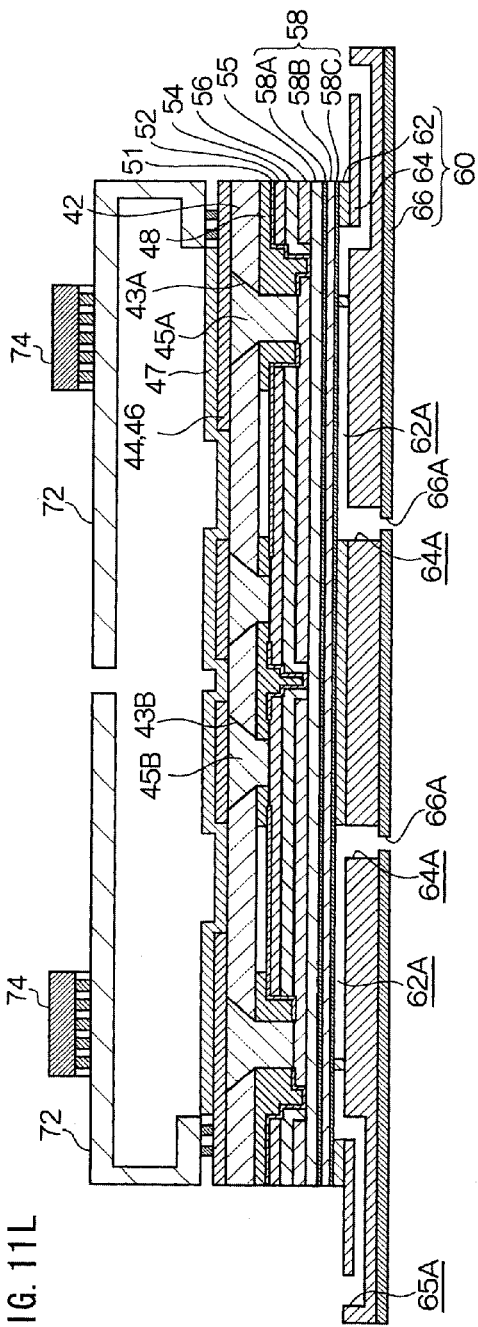

Next, as shown in FIG. 11K, the drive IC 74 and the discrete wiring 44 are connected through the flexible print-circuit board 72. Then, as shown in FIG. 11L, the communicating path substrate 64 with the communicating path 64A formed is joined to the lower side of the pressure chamber substrate 62, and the nozzle substrate 66 with the nozzle 66A formed is joined to the lower side thereof.

Figure 11M:
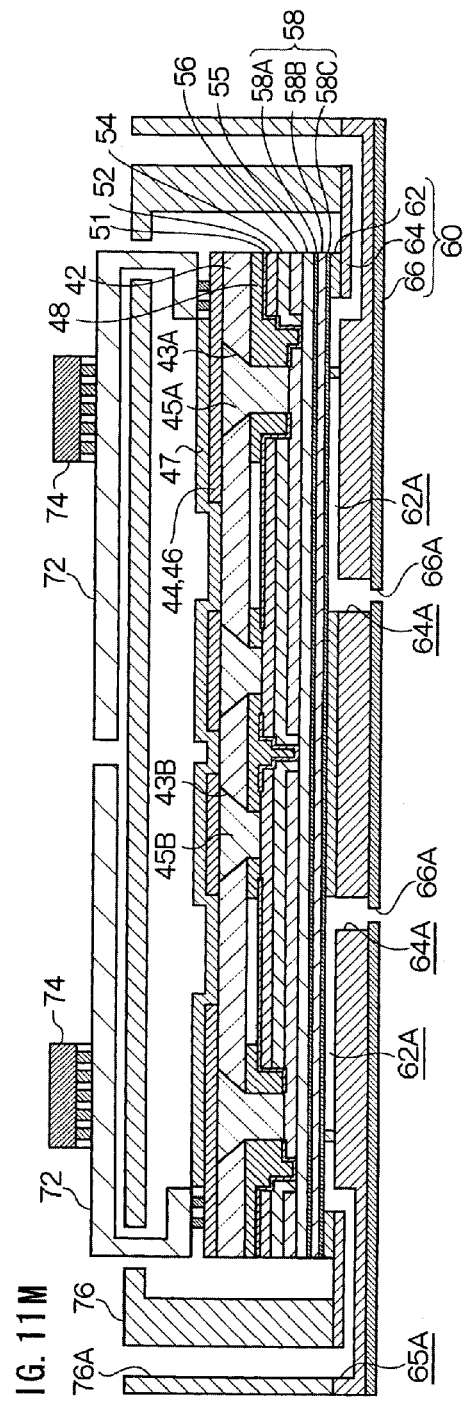

Then, as shown in FIG. 11M, the manifold 76 is joined to the upper outer periphery of the communicating path substrate 64 so that the top board member 40 and the piezoelectric element member 50 are covered and the ink path 76A is disposed on extension of the ink supply port 65A of the communicating path substrate 64. The drive IC 74 connected to the other end of the flexible print-circuit board 72 is pulled out of the upper part to the outside of the manifold 76.

In the ink-jet recording device 10 provided with the ink-jet recording head 32 manufactured as the above, actions thereof are next described. First, an electric signal for commanding printing is sent to the ink-jet recording device 10, and then the recording paper P is picked up by one sheet from the stocker 24 and conveyed by the conveying device 26.

On the other hand, in the ink-jet recording unit 30, the ink 100 is already injected from an ink tank through an ink supply port and the ink supply port 65A of the ink-jet recording head 32, and supplied (filled) to the pressure chamber 62A. Then, a meniscus such that the surface of the ink 100 is slightly hollowed toward the pressure chamber 62A side is formed at the top (an ejection port) of the nozzle 66A.

Then, ink droplets are selectively ejected from the plural nozzles 66A while conveying the recording paper P, so that a part of an image based on an image data is recorded on the recording paper P. That is to say, the drive IC 74 impresses voltage on the predetermined piezoelectric substance 54 at the predetermined timing to cause flexure deformation (out-of-plane vibration) in the diaphragm 58 in the vertical direction, and pressurize the ink 100 in the pressure chamber 62A, which ink is ejected as ink droplets from the predetermined nozzle 66A. Thus, the image based on the image data is completely recorded on the recording paper P, which is discharged into the tray 25 by the paper discharge belt 23. Thus, printing process (image recording) on the recording paper P is completed.

In the ink-jet recording head 32 of the exemplary embodiment, the orientation auxiliary layer 55 is formed on the diaphragm 58, so that the piezoelectric substance 54 may be oriented also in the uncoated portion 54E with no lower electrode 56 disposed. Accordingly, orientation property of the piezoelectric substance 54 in the uncoated portion 54E may be improved as compared with the case where the piezoelectric substance layer is formed without forming the orientation auxiliary layer.

Figure 12:
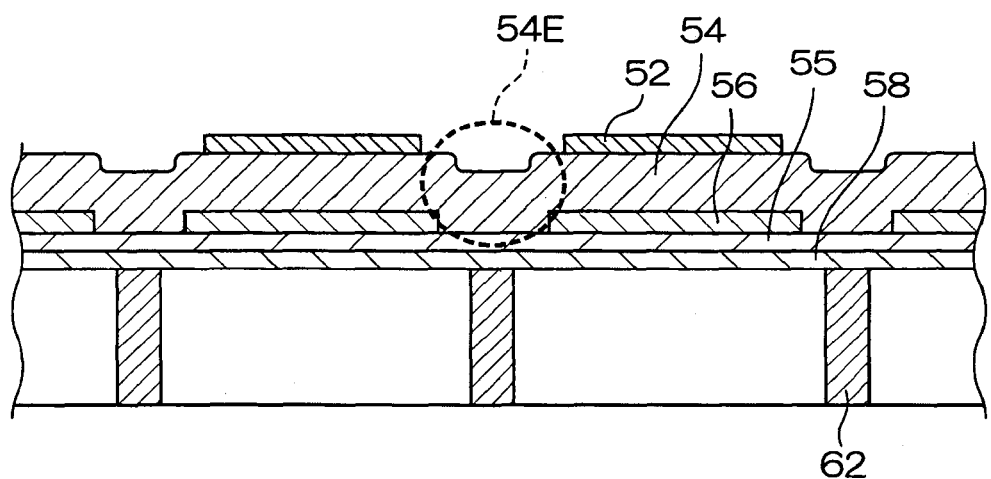
FIG. 12 is a schematic view showing a piezoelectric substance according to a modification of the first exemplary embodiment.

An example such that each of the piezoelectric substances 54 is individually disposed while separated from the adjacent piezoelectric substances 54 is described in the exemplary embodiment; however, each of the piezoelectric substances 54 need not always be separated, and may be the piezoelectric substance 54 constituted successively with the adjacent piezoelectric substances as shown in FIG. 12. In particular, the separation as in the exemplary embodiment allows piezoelectric properties of the piezoelectric substance to be improved.

Figure 13A:
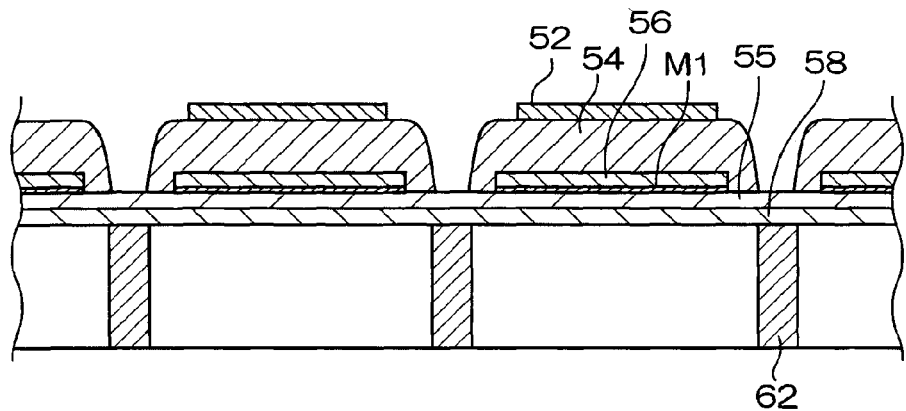
FIGS. 13A to 13C are schematic views showing a piezoelectric substance according to another modification of the first exemplary embodiment.

Also, as shown in FIG. 13A, an adhesive layer M1 may be provided between the orientation auxiliary layer 55 and the lower electrode 56 of the exemplary embodiment. The provision of the adhesive layer M1 allows joining between the lower electrode 56 and the orientation auxiliary layer 55 to be rendered favorable. Oxides of Ti and Ni may be used as the adhesive layer M1.

Figure 13B:
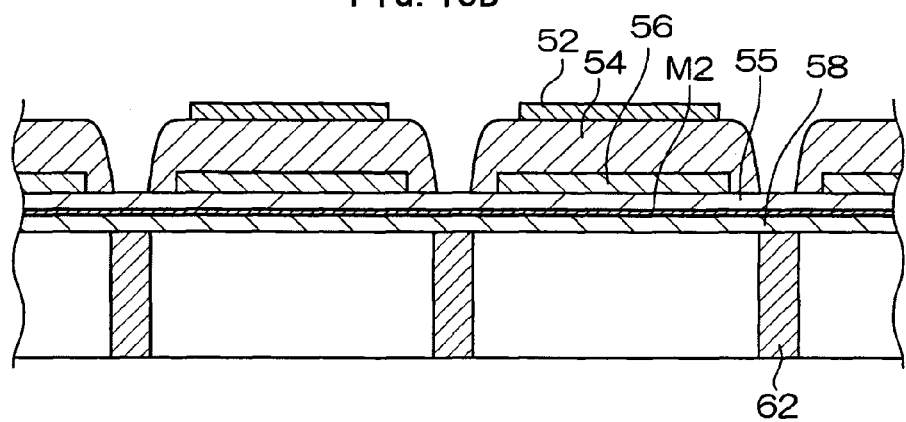

Also, as shown in FIG. 13B, an adhesive layer M2 may be provided between the orientation auxiliary layer 55 and the diaphragm 58 of the exemplary embodiment. The provision of the adhesive layer M2 allows joining between the diaphragm 58 and the orientation auxiliary layer 55 to be rendered favorable. Oxides of Ti and Ni may be used as the adhesive layer M2.

Figure 13C:
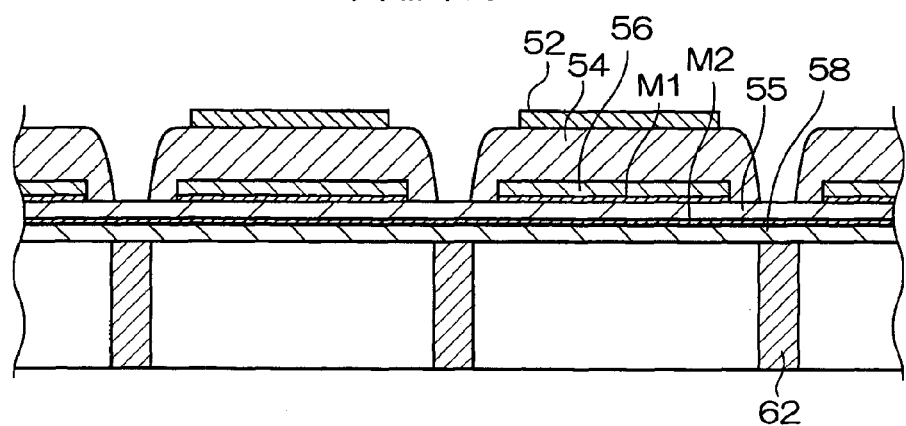

Further, as shown in FIG. 13C, both the adhesive layer M1 and the adhesive layer M2 may be provided.

Figure 14A:
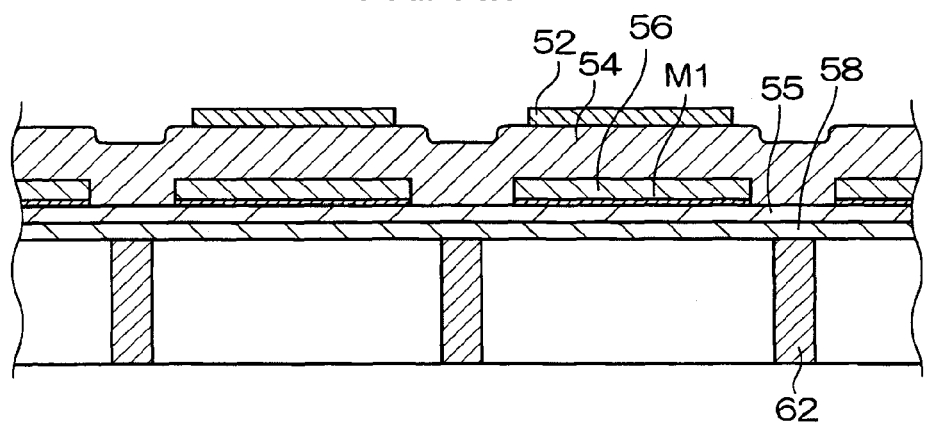
FIGS. 14A to 14C are schematic views showing a piezoelectric substance according to another modification of the first exemplary embodiment.
Figure 14B:
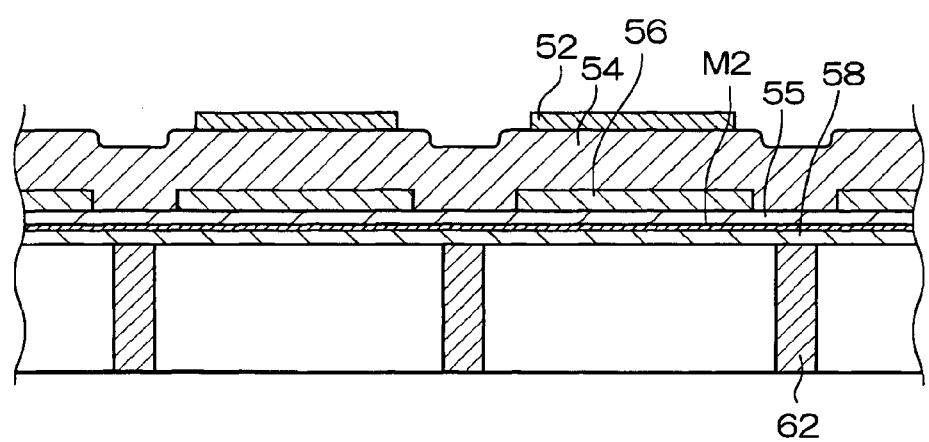
Figure 14C:
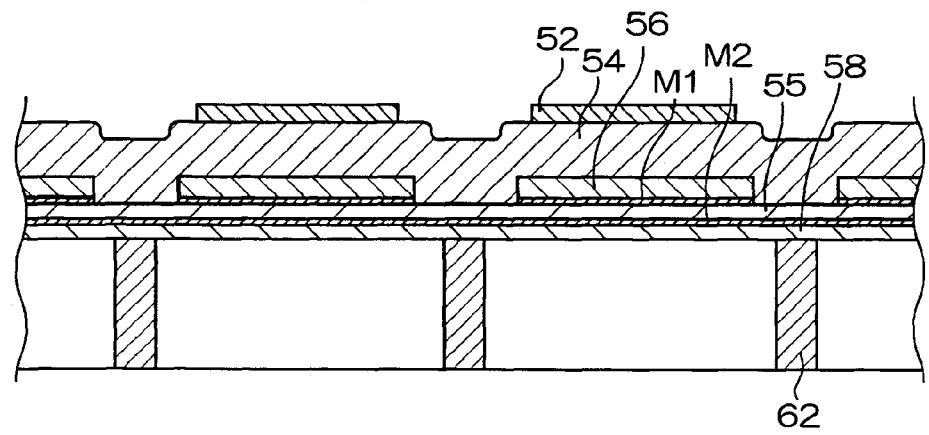

Also, in the case where the piezoelectric substance 54 is constituted as a modification of the exemplary embodiment, the adhesive layer M1 may be provided as shown in FIG. 14A, the adhesive layer M2 may be provided as shown in FIG. 14B, and the adhesive layer M1 and the adhesive layer M2 may be provided as shown in FIG. 14C.

A Second Exemplary Embodiment

Next, a second exemplary embodiment is described. The exemplary embodiment is the same as a first exemplary embodiment except for providing a flattening film 53. The same portions as a first exemplary embodiment is shown in Fig. by marking the same and detailed description is omitted.

Figure 15A:
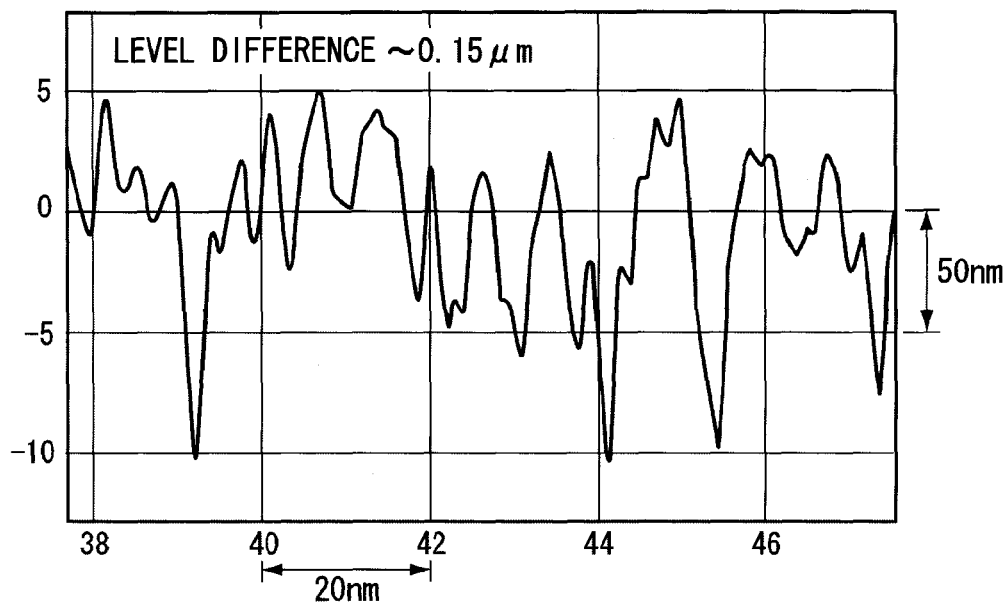
FIG. 15A is a graph showing a level difference on the surface of a PZT film.
Figure 15B:
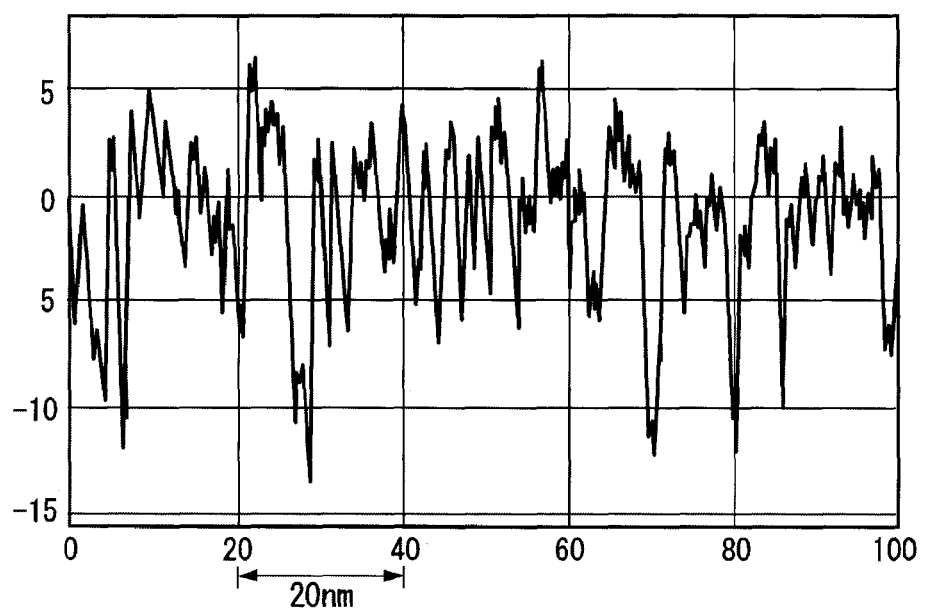
FIG. 15B is a graph showing a level difference on the surface of a protective film.
Figure 16A:
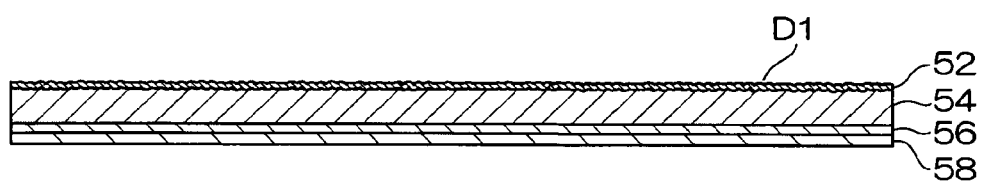
FIG. 16A is a schematic view in a state such that an upper electrode layer is formed.

FIG. 15A shows the result of measuring level difference (refer to FIG. 16A) of a surface D1 on an upper electrode film after making a PZT film 54M as the piezoelectric substance 54 to thereafter make the upper electrode film 52M as the upper electrode 52 further. FIG. 15B shows the result of measuring level difference (refer to FIG. 16B) of a surface D2 on the protective film 51 after further making the protective film 51 on the upper electrode film 52M. As shown in a graph of FIG. 15A, irregularities of level difference with approximately 0.15 μm at the maximum are made on the surface of the upper electrode film 52M. Irregularities of level difference with approximately 0.15 μm at the maximum are made also on the surface of the protective film 51, and the pitch of the irregularities is smaller than the surface of the upper electrode film 52M.

Figure 16B:
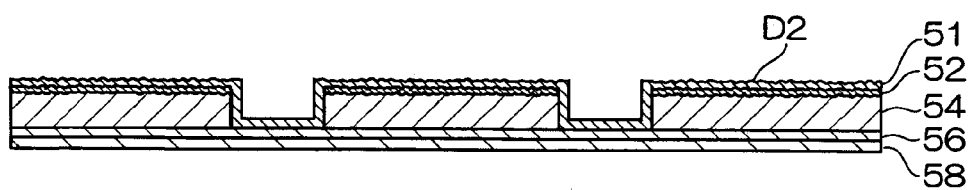
FIG. 16B is a schematic view in a state such that a protective film is formed on FIG. 16A.

On the other hand, as shown in FIG. 16B, with regard to a portion obtained by patterning and removing the upper electrode film 52M and the PZT film 54M, it was found that the protective film 51 with a flat surface was formed on both the lower electrode 56 and the side wall of the PZT film. Accordingly, it is found that the irregularities on the surface of the protective film 51 result from the irregularities on the surface of the upper electrode film 52M.

Thus, when irregularities are caused on the surface of the upper electrode film 52M and the PZT film 54M, the problem may be that line width dispersion of a photoresist film used for patterning the upper electrode film 52M and the PZT film 54M is caused, so that a resist pattern may not exactly be formed. Resist strippable property on the PZT film 54M is also decreased. Then, it is conceived that abnormal growth of the protective film on the PZT film is caused. Also, when irregularities are caused on the surface of the protective film 51, the effect of protecting by the protective film 51 is decreased, and strippable property of the resist film is decreased and the residue remains easily in the processes of etching and photoresist removing of the protective film. In the case of forming a resin film (the partition wall member 48) on the protective film 51, line width dispersion of a photoresist film used for patterning is caused (reflection of the ground), so that a resist pattern may not exactly be formed and resist strippable property is also decreased. Thus, the flattening film 53 is formed in the exemplary embodiment.

Figure 17:
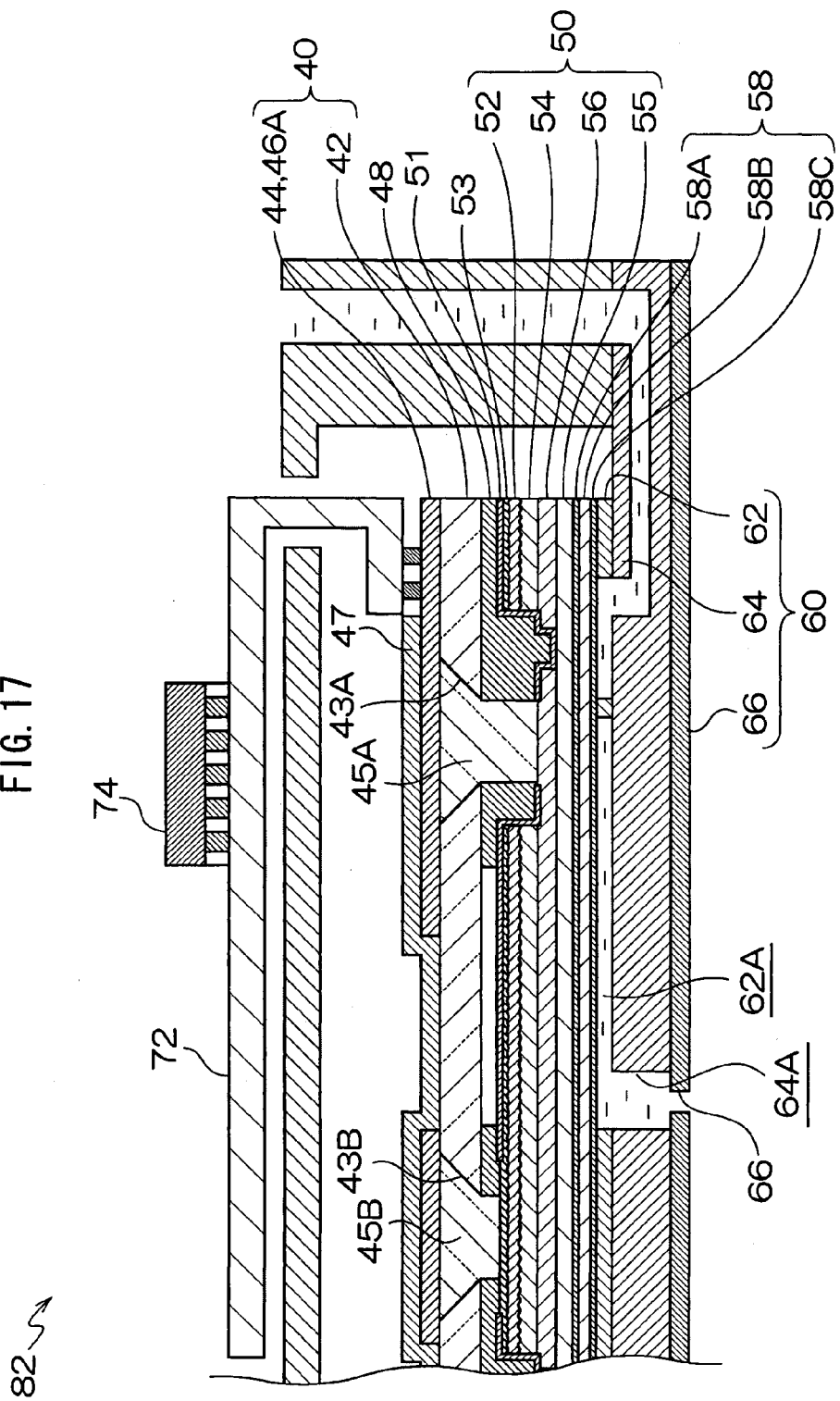
FIG. 17 is a schematic cross-sectional view showing the configuration of an ink-jet recording head of a second exemplary embodiment.

As shown in FIG. 17, the ink-jet recording head 82 of the exemplary embodiment is provided with the top board member 40, the piezoelectric element member 50, the diaphragm 58 and the flow path member 60. The flattening film 53 is formed on the upper face of the upper electrode 52 of the piezoelectric element member 50. Materials such as SOG (photosensitive glass material), $SiO_2$ doped with impurities, BPSG, PSG and BSG may be used as the flattening film 53. The surface of the flattening film 53 is flattened by reflowing and the protective film 51 is formed thereon. The flattening film 53 may be the minimum film thickness for relaxing the level difference. An antireflective film having antireflective function, an adhesive film for improving adhesive properties and a film having both of the functions may be also formed thinly on the upper electrode 52.

The protective film 51 may be formed out of $SiO_2$, SiN, SiON and SiCN by using sputtering and CVD.

Next, manufacturing steps (manufacturing processes) of the ink-jet recording head 32 of the exemplary embodiment are described in detail based on FIGS. 18A to 18M.

First, as shown in FIG. 18A, the diaphragm 58, the orientation auxiliary layer 55, the lower electrode 56, the PZT film 54M and the upper electrode film 52M are sequentially formed on the pressure chamber substrate 62. The PZT layer may be formed by a sputtering method, and sol-gel and aerosol deposition. Ir and Pt may be used as materials for the upper electrode film 52M.

$TiO_2$ having antireflective effect and adhesive effect, not shown in Fig., is preferably formed with a film thickness of approximately 10 to 50 nm on the upper electrode film 52M.

Next, as shown in FIG. 18B, the flattening film 53 is formed on the upper electrode 52. The flattening film 53 may be formed by SOG (Spin on Glass) method. Specifically, solution such that a silicic acid compound is dissolved in organic solvent is spin-coated and fired to form the film. SOG may be applied once or over plural times. The film thickness of the flattening film 53 may be so thick as to solve the level difference, preferably approximately 0.1 to 0.5 μm.

Next, as shown in FIG. 18C, resist R for etching the upper electrode 52 and the piezoelectric substance 54 (the PZT layer) is spin-coated.

Figure 18D:
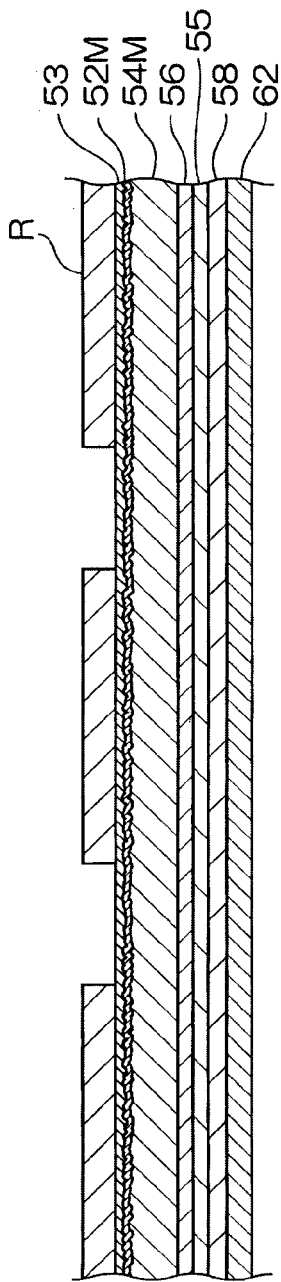
FIGS. 18A to 18N are explanatory views showing the process for manufacturing a piezoelectric element member on a pressure chamber substrate according to the second exemplary embodiment.

Then, as shown in FIG. 18D, a resist pattern is formed by the processes of exposing and developing. At this time, the formation of $TiO_2$ as an antireflective film on the upper electrode 52 allows a defect to be prevented from occurring on the resist pattern.

Figure 18E:
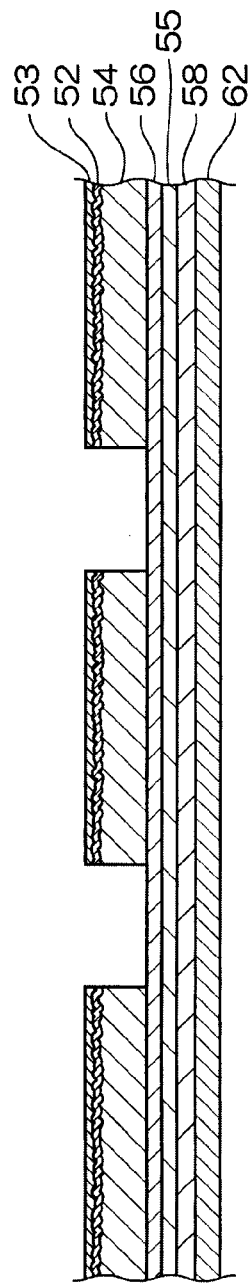

Next, as shown in FIG. 18E, the upper electrode film 52M and the PZT film 54M are patterned by dry etching. The resist stripping may be performed by wet resist stripping with amine organic solvent, and an ashing ($O_2$ plasma) device. The flattening film 53 is disposed in the exemplary embodiment, so that the stripping of the resist R may be easily performed. Thus, the upper electrode 52 and the piezoelectric substance 54 are constituted.

Figure 18F:
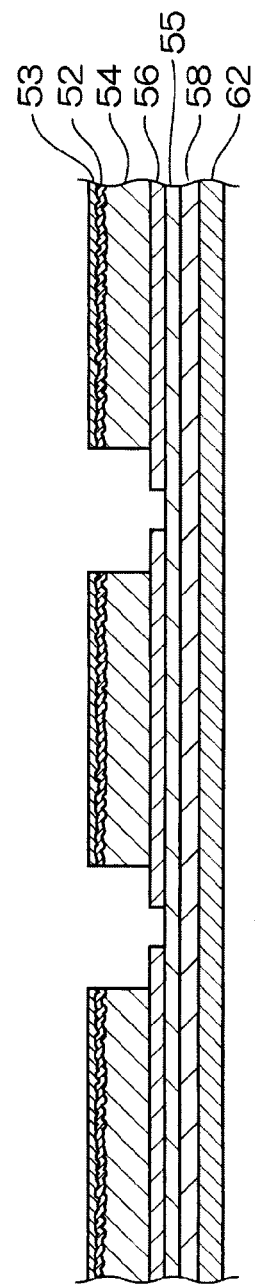

Next, as shown in FIG. 18F, the lower electrode 56 formed on the upper face of the diaphragm 58 is patterned. Specifically, the manner is as follows: resist formation by a photolithography method, patterning, dry etching by RIE method (using $Cl_2$ gas) and resist stripping by oxygen plasma.

Figure 18G:
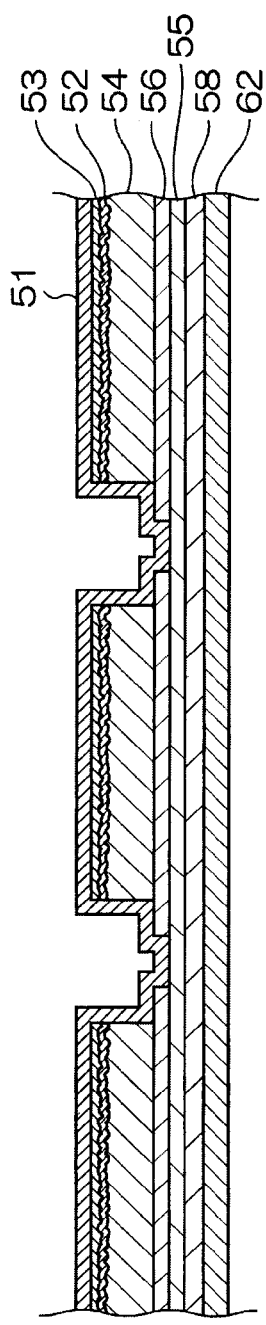

Next, as shown in FIG. 18G, the protective film 51 is formed. The flattening film 53 is formed in the exemplary embodiment, so that no voids are caused in the protective film 51, leading to favorable formation of the protective film 51.

Figure 18H:
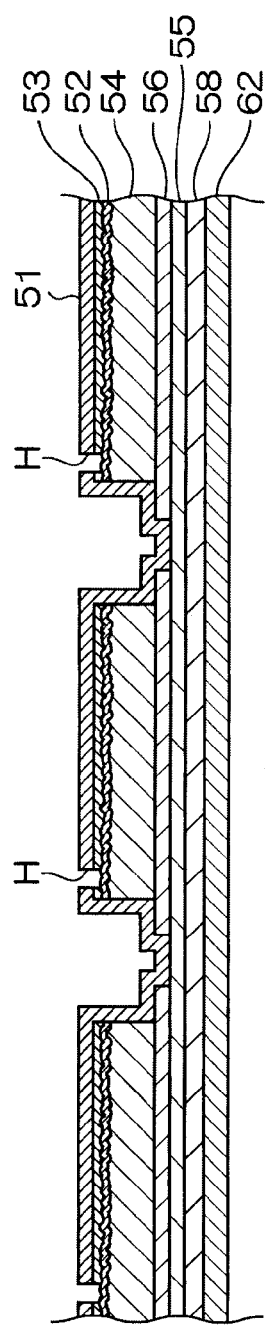

Next, as shown in FIG. 18H, a contact hole H for electrically connecting to the upper electrode 52 is opened by a photolithographic process.

Figure 18I:
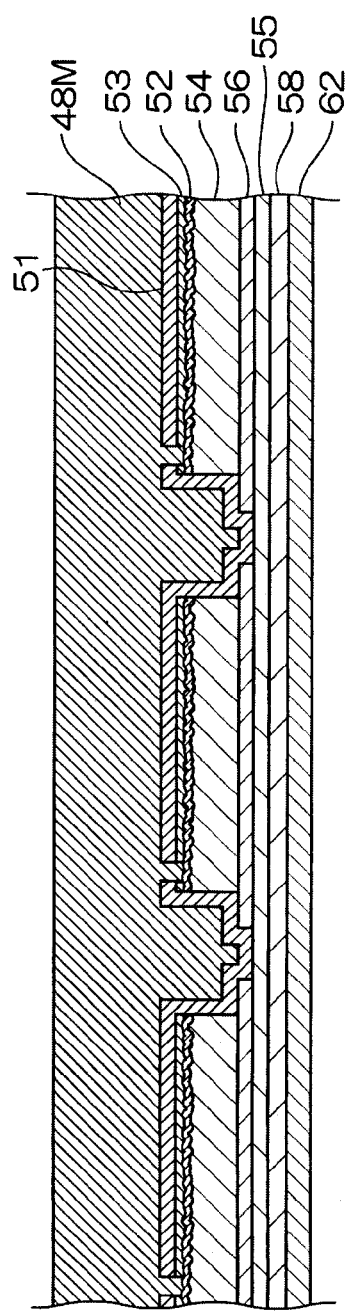

Next, as shown in FIG. 18I, a resin film 48M composing the partition wall member 48 is formed. The resin film 48M may be formed by spin-coating photosensitive polyimide or epoxy resin. The film thickness of the resin film 48M is preferably approximately 5 to 10 μm.

Figure 18J:
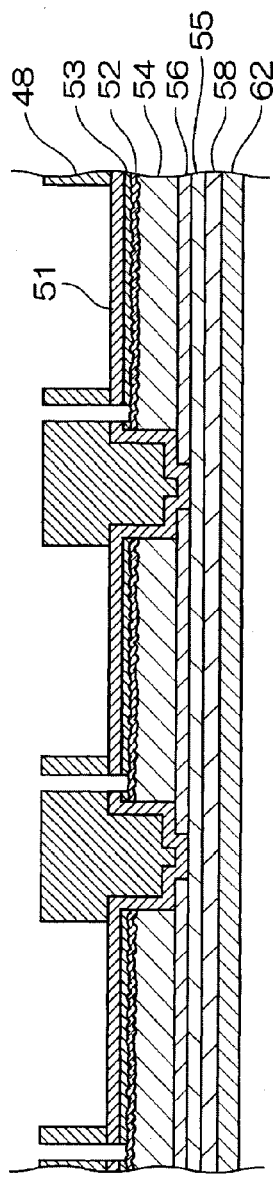

Next, as shown in FIG. 18J, the resin film 48M is patterned through the processes of exposing and developing. The flattening film 53 is formed in the exemplary embodiment, so that the protective film 51 is flat and a favorable pattern may be formed with no erratic stitch pattern.

Figure 18K:
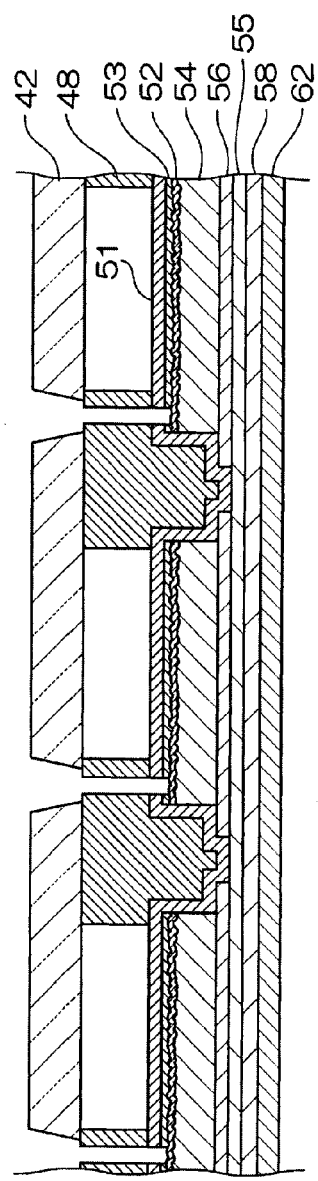
Figure 18L:
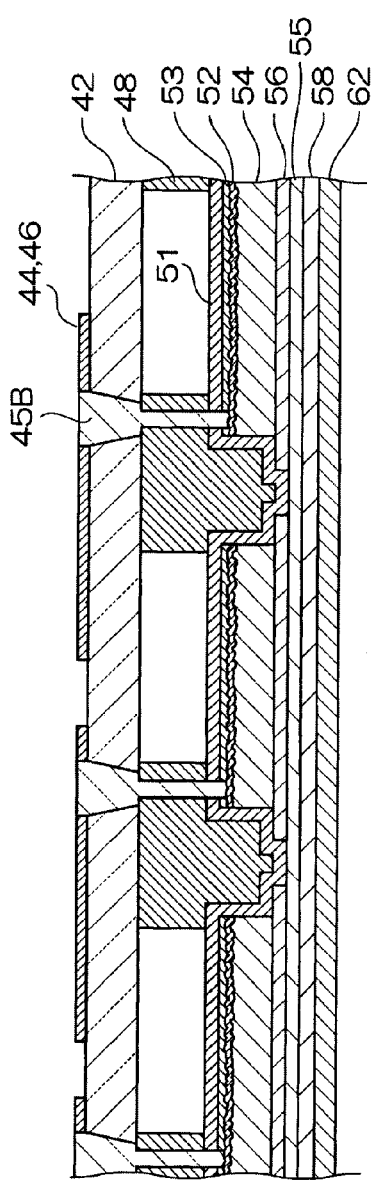

Next, as shown in FIG. 18K, the top board 42 is disposed on the partition wall member 48, and as shown in FIG. 18L, a pattern of the discrete wiring 44 and the GND wiring 46 is formed on the top board 42 to supply the first conductive member 45A (not shown in Fig.) and the second conductive member 45B, and then connect the discrete wiring 44 and the GND wiring 46 to the lower electrode 56 and the upper electrode 52, respectively.

Figure 18M:
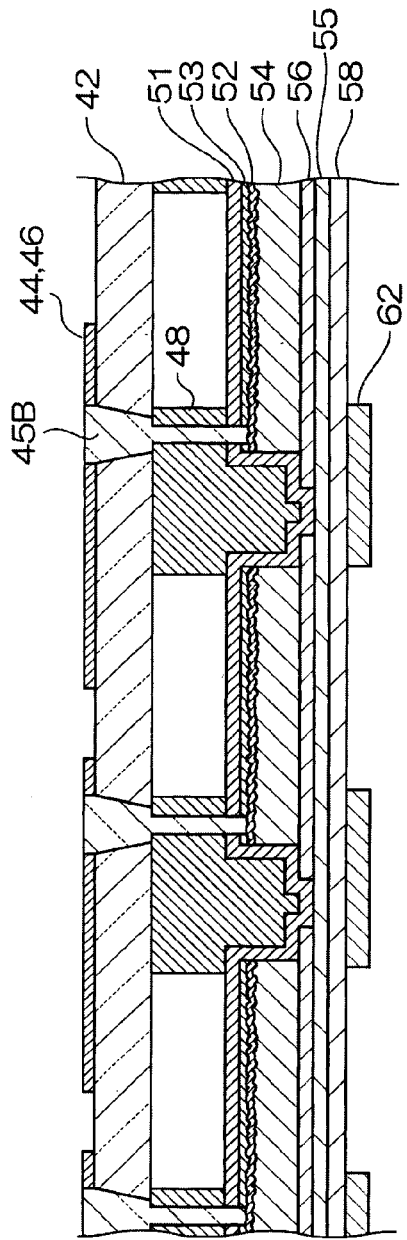
Figure 18N:
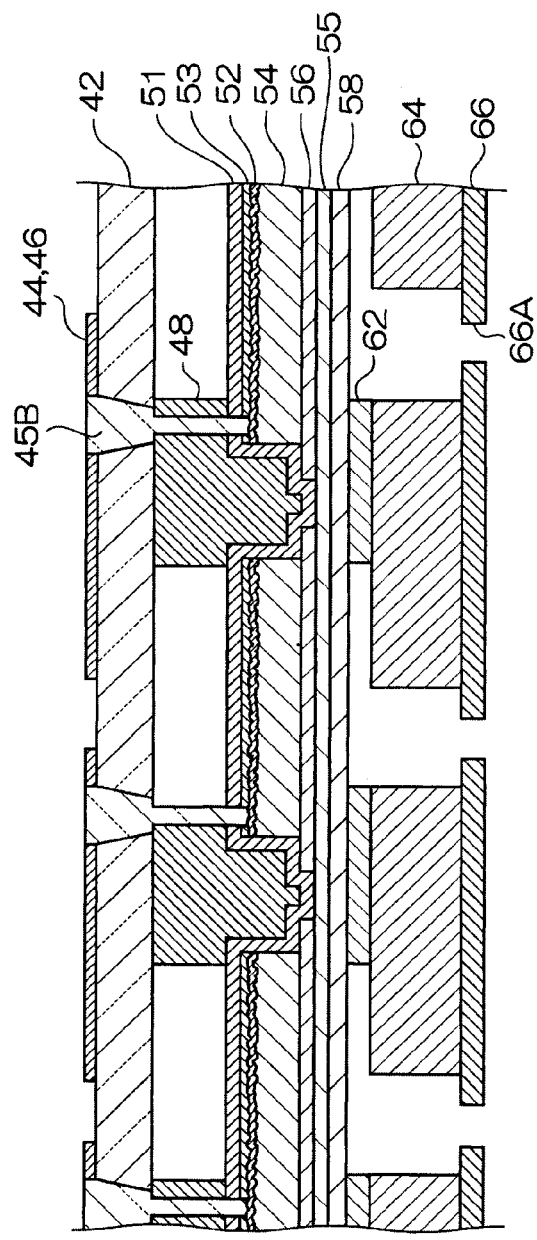

Next, as shown in FIG. 18M, the pressure chamber 62A is constituted in the pressure chamber substrate 62, and as shown in FIG. 18-5N, the communicating path substrate 64 and the nozzle substrate 66 are joined.

According to the exemplary embodiment, a plane with the protective film 51 formed is flattened by the flattening film 53, so that the protective film 51 may be favorably formed, and inconveniences such as residue and difficulty in resist stripping may be restrained in the processes hereafter.

Figure 19:
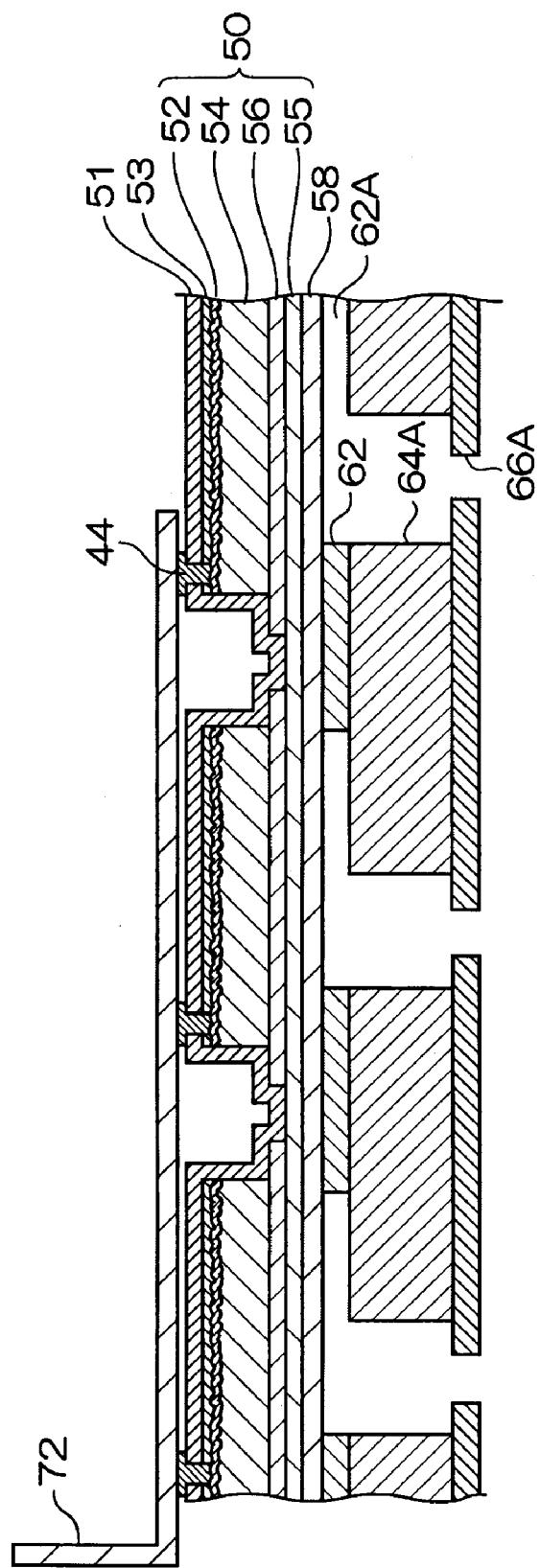
FIG. 19 is a schematic cross-sectional view showing the configuration of an ink-jet recording head according to a modification of the second exemplary embodiment.

An example such that the partition wall member 48 is formed to laminate the top board 42 thereon and form a wiring pattern on the upper face of the top board 42 is described in the exemplary embodiment, and as shown in FIG. 19, the flexible print-circuit board 72 may be disposed on the piezoelectric element member 50, and directly connected to the discrete wiring 44 and the GND wiring 46.

Figure 20:
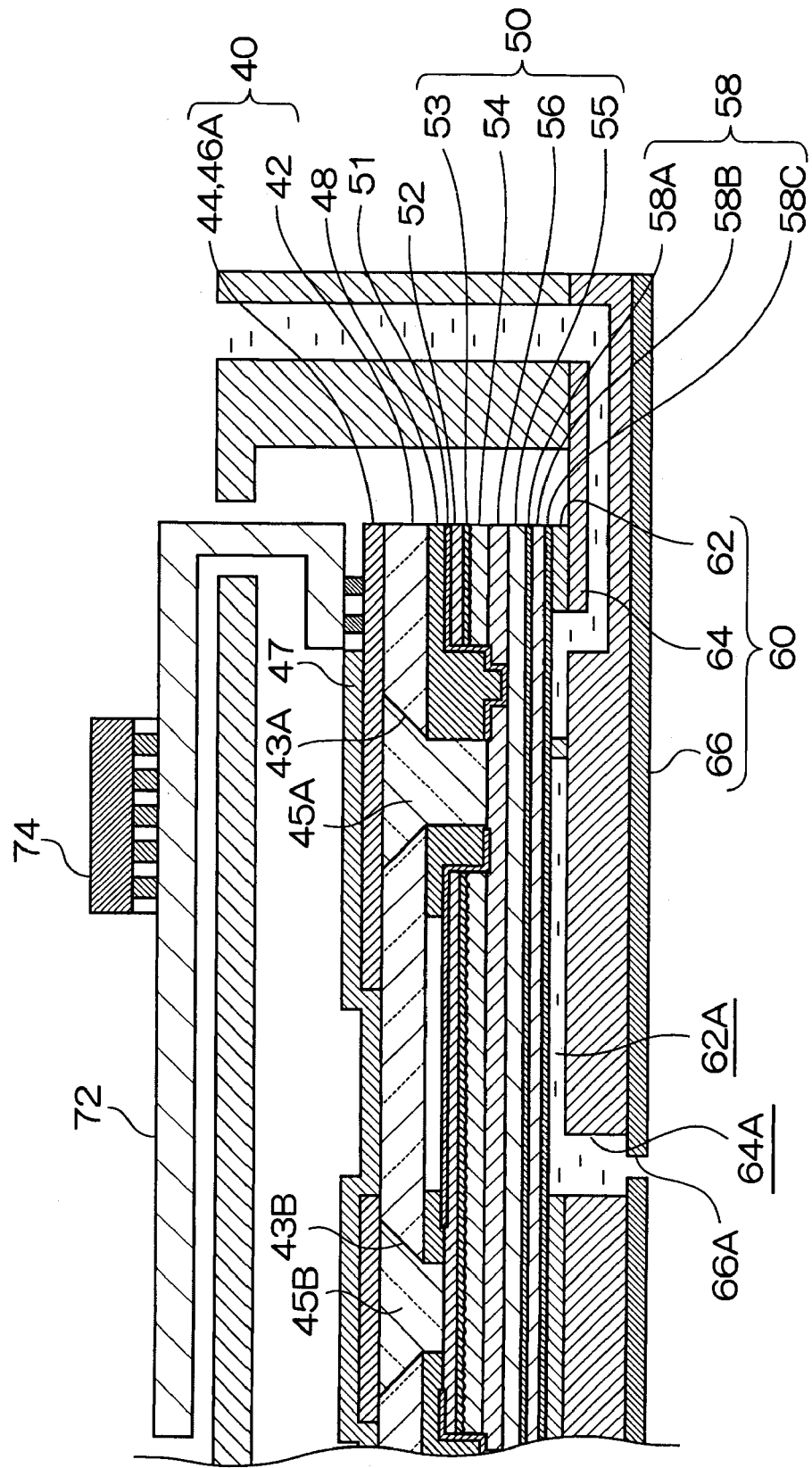
FIG. 20 is a schematic cross-sectional view showing the configuration of an ink-jet recording head according to another modification of the second exemplary embodiment.
Figure 21:
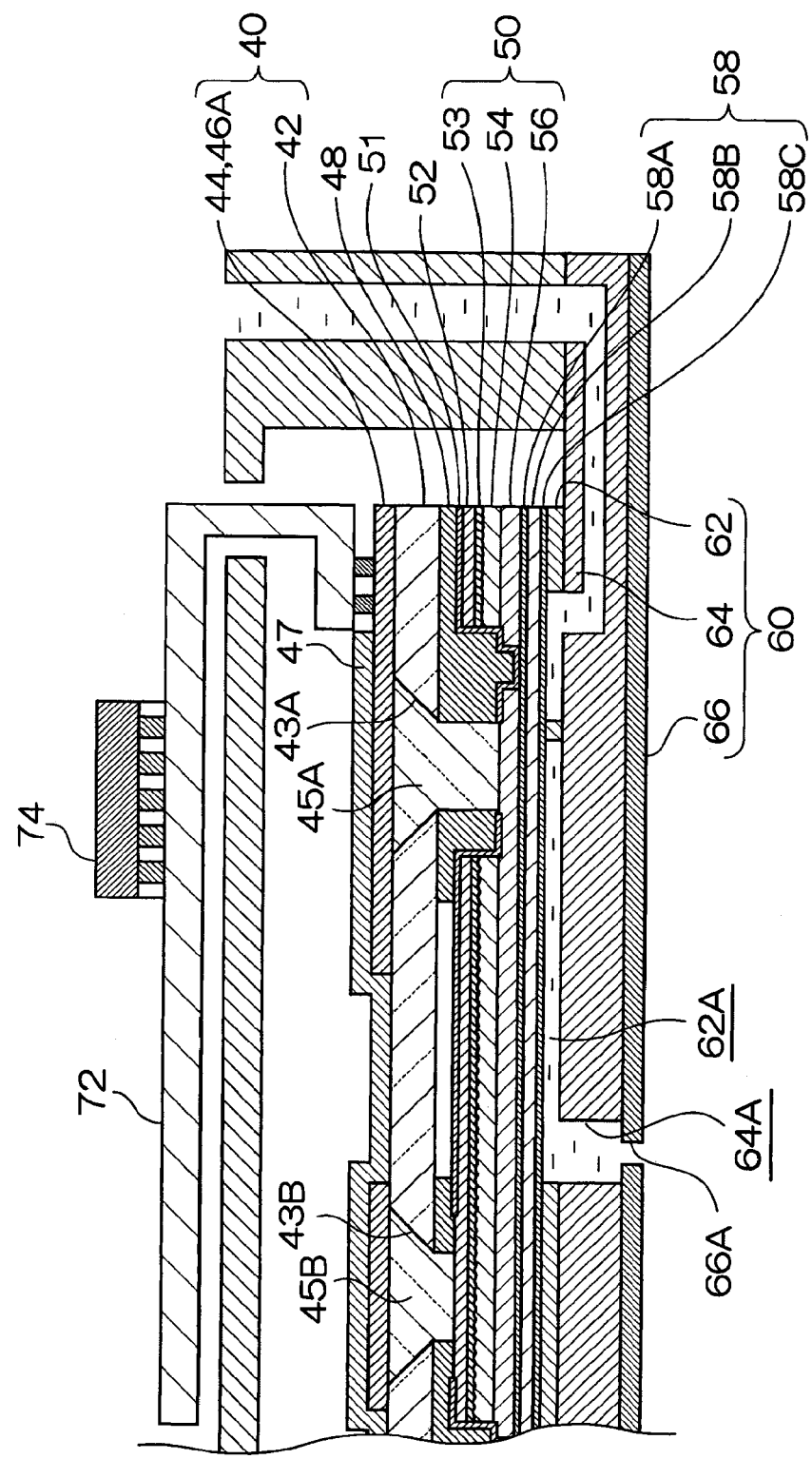
FIG. 21 is a schematic cross-sectional view showing the configuration of an ink-jet recording head according to another modification of the second exemplary embodiment.

In the exemplary embodiment, the flattening film 53 is formed on the upper electrode 52, and as shown in FIG. 20, the flattening film 53 may be formed on the piezoelectric substance 54.

A piezoelectric element substrate of a first aspect of the invention is including a support substrate, an insulating orientation auxiliary layer formed on the support substrate, a lower electrode layer formed on the orientation auxiliary layer so that an uncoated portion where the orientation auxiliary layer is not coated with the lower electrode layer is constituted at at least a portion thereof, a piezoelectric substance layer formed on the lower electrode layer and the uncoated portion of the orientation auxiliary layer, and an upper electrode layer formed on the piezoelectric substance layer; wherein the orientation auxiliary layer and the piezoelectric substance layer comprise a material of the same crystal system.

According to the first aspect of the invention, orientation property of the piezoelectric substance layer in the uncoated portion may be improved as compared with the case where the piezoelectric substance layer is formed on the support substrate by a thin-film formation method without forming the orientation auxiliary layer.

A piezoelectric element substrate of a second aspect of the invention is characterized in that the lower electrode layer and the piezoelectric substance layer comprise a material of the same crystal system.

A piezoelectric element substrate of a third aspect of the invention is characterized in that the piezoelectric substance layer is discontinuous such that the piezoelectric substance does not cover at least a part of the uncoated portion.

A liquid droplet ejecting head of a fourth aspect of the invention is a liquid droplet ejecting head provided with the piezoelectric element substrate according to any one of the first to third aspects, including a nozzle for ejecting liquid droplets, and a pressure chamber communicating with the nozzle and filled with liquid droplets; wherein at least a side of the pressure chamber that is opposite from the nozzle is constituted while comprising the support substrate of the piezoelectric element substrate, and liquid droplets are ejected from the nozzle in such a manner that the support substrate is vibrated by displacement of the piezoelectric substance layer of the piezoelectric element substrate.

A liquid droplet ejecting head of a fifth aspect of the invention is characterized in that a flattened layer with a flat surface is formed on the upper face of the piezoelectric substance layer or upper electrode layer of the piezoelectric element substrate.

A liquid droplet ejecting device of a sixth aspect of the invention is provided with the liquid droplet ejecting head according to the fourth aspect or the fifth aspect.

A manufacturing method for a piezoelectric element substrate of a seventh aspect of the invention is a manufacturing method for the piezoelectric element substrate according to any one of the first to third aspects, characterized by including an orientation auxiliary layer forming process for forming on the support substrate an orientation auxiliary layer containing a material of the same crystal system as a piezoelectric element layer, and a piezoelectric element layer forming process for forming on the orientation auxiliary layer the lower electrode layer, the piezoelectric substance layer and the upper electrode layer; wherein at least the lower electrode layer is patterned while including an etching process.

What is claimed is:

1. A piezoelectric element substrate comprising:
   a support substrate;
   an insulating orientation auxiliary layer formed on the support substrate;
   a lower electrode layer formed on the orientation auxiliary layer so that an uncoated portion where the orientation auxiliary layer is not coated with the lower electrode layer is constituted at at least a portion thereof;
   a piezoelectric substance layer formed on the lower electrode layer and the uncoated portion of the orientation auxiliary layer;
   an upper electrode layer formed on the piezoelectric substance layer; and
   a flattened layer with a flat surface formed on the upper electrode layer of the piezoelectric element substrate;
   wherein the orientation auxiliary layer and the piezoelectric substance layer comprise a material of the same crystal system, and the lower electrode layer and the piezoelectric substance layer comprise a material of the same crystal system.

2. The piezoelectric element substrate of claim 1, wherein the piezoelectric substance layer is divided into plural pieces and respective pieces of the piezoelectric substance layer are separated from one another so as not to cover at least a part of the uncoated portion.

3. The piezoelectric element substrate of claim 1, wherein the piezoelectric substance layer is discontinuous such that the piezoelectric substance does not cover at least a part of the uncoated portion.

4. A liquid droplet ejecting head comprising:
   the piezoelectric element substrate of claim 1;
   a nozzle for ejecting liquid droplets; and
   a pressure chamber communicating with the nozzle and filled with liquid droplets,
   wherein at least a side of the pressure chamber that is opposite from the nozzle is constituted while comprising the support substrate of the piezoelectric element substrate; and
   liquid droplets are ejected from the nozzle in such a manner that the support substrate is vibrated by displacement of the piezoelectric substance layer of the piezoelectric element substrate.

5. The liquid droplet ejecting head of claim 4, wherein the piezoelectric substance layer is discontinuous such that the piezoelectric substance does not cover at least a part of the uncoated portion.

6. A liquid droplet ejecting device comprising the liquid droplet ejecting head of claim 4.

7. A manufacturing method for the piezoelectric element substrate of claim 1, comprising:
   an orientation auxiliary layer formation process for forming on the support substrate the orientation auxiliary layer comprising a material of the same crystal system as a piezoelectric element layer; and
   a piezoelectric element layer formation process for forming on the orientation auxiliary layer the lower electrode layer, the piezoelectric substance layer and the upper electrode layer,
   wherein at least the lower electrode layer is patterned by a process comprising an etching process.

* * * * *